(12) United States Patent
Lucas et al.

(10) Patent No.: US 9,235,245 B2
(45) Date of Patent: Jan. 12, 2016

(54) STARTUP PERFORMANCE AND POWER ISOLATION

(71) Applicant: SanDisk Enterprise IP LLC, Milpitas, CA (US)

(72) Inventors: Gregg S. Lucas, Tucson, AZ (US); Kenneth B. Delpapa, Natick, MA (US); Robert W. Ellis, Phoenix, AZ (US)

(73) Assignee: SANDISK ENTERPRISE IP LLC, Milpitas, CA (US)

( * ) Notice: Subject to any disclaimer, the term of this patent is extended or adjusted under 35 U.S.C. 154(b) by 216 days.

(21) Appl. No.: 14/135,407

(22) Filed: Dec. 19, 2013

(65) Prior Publication Data
US 2015/0153799 A1      Jun. 4, 2015

Related U.S. Application Data

(60) Provisional application No. 61/911,933, filed on Dec. 4, 2013.

(51) Int. Cl.
*G06F 1/00* (2006.01)
*G06F 1/26* (2006.01)

(52) U.S. Cl.
CPC ............... *G06F 1/263* (2013.01); *G06F 1/266* (2013.01)

(58) Field of Classification Search
CPC ................................. G06F 1/263; G06F 1/266
USPC .................................. 713/300, 320, 322, 330
See application file for complete search history.

(56) References Cited

U.S. PATENT DOCUMENTS

| 4,173,737 | A | 11/1979 | Skerlos et al. |
| 4,888,750 | A | 12/1989 | Kryder et al. |
| 4,916,652 | A | 4/1990 | Schwarz et al. |
| 5,129,089 | A | 7/1992 | Nielsen |

(Continued)

FOREIGN PATENT DOCUMENTS

| EP | 1 299 800 | 4/2003 |
| EP | 1465203 A1 | 10/2004 |

(Continued)

OTHER PUBLICATIONS

Invitation to Pay Additional Fees dated Feb. 13, 2015, received in International Patent Application No. PCT/US2014/063949, which corresponds to U.S. Appl. No. 14/135,433, 6 pages (Delpapa).

(Continued)

*Primary Examiner* — Mark Connolly
(74) *Attorney, Agent, or Firm* — Morgan, Lewis & Bockius LLP

(57) ABSTRACT

The various implementations described herein include systems, methods and/or devices used to protect data in a storage device. In one aspect, a method includes (1) powering a power control processor (PCP) (also sometimes called a storage-level microcontroller) using a first input voltage, (2) while the PCP is powered using the first input voltage: (a) operating the PCP in a first mode, and (b) enabling charging of an energy storage device, (3) after achieving a predefined internal state, which includes the energy storage device charged to a predefined level, powering the PCP using a power supply voltage distinct from the first input voltage, and (4) while the PCP is powered using the power supply voltage, operating the PCP in a second mode, where the PCP operates at a higher performance level in the second mode than in the first mode.

28 Claims, 10 Drawing Sheets

(56) References Cited

U.S. PATENT DOCUMENTS

| | | |
|---|---|---|
| 5,270,979 A | 12/1993 | Harari et al. |
| 5,329,491 A | 7/1994 | Brown et al. |
| 5,381,528 A | 1/1995 | Brunelle |
| 5,519,847 A | 5/1996 | Fandrich et al. |
| 5,530,705 A | 6/1996 | Malone, Sr. |
| 5,537,555 A | 7/1996 | Landry et al. |
| 5,551,003 A | 8/1996 | Mattson et al. |
| 5,636,342 A | 6/1997 | Jeffries |
| 5,657,332 A | 8/1997 | Auclair et al. |
| 5,666,114 A | 9/1997 | Brodie et al. |
| 5,708,849 A | 1/1998 | Coke et al. |
| 5,765,185 A | 6/1998 | Lambrache et al. |
| 5,890,193 A | 3/1999 | Chevallier |
| 5,936,884 A | 8/1999 | Hasbun et al. |
| 5,943,692 A | 8/1999 | Marberg et al. |
| 5,982,664 A | 11/1999 | Watanabe |
| 6,000,006 A | 12/1999 | Bruce et al. |
| 6,006,345 A | 12/1999 | Berry, Jr. |
| 6,016,560 A | 1/2000 | Wada et al. |
| 6,018,304 A | 1/2000 | Bessios |
| 6,044,472 A * | 3/2000 | Crohas .............. G06F 1/266 713/300 |
| 6,070,074 A | 5/2000 | Perahia et al. |
| 6,119,250 A | 9/2000 | Nishimura et al. |
| 6,138,261 A | 10/2000 | Wilcoxson et al. |
| 6,182,264 B1 | 1/2001 | Ott |
| 6,192,092 B1 | 2/2001 | Dizon et al. |
| 6,295,592 B1 | 9/2001 | Jeddeloh |
| 6,311,263 B1 | 10/2001 | Barlow et al. |
| 6,408,394 B1 | 6/2002 | Vander Kamp et al. |
| 6,412,042 B1 | 6/2002 | Paterson et al. |
| 6,442,076 B1 | 8/2002 | Roohparvar |
| 6,449,625 B1 | 9/2002 | Wang |
| 6,484,224 B1 | 11/2002 | Robins et al. |
| 6,516,437 B1 | 2/2003 | Van Stralen et al. |
| 6,564,285 B1 | 5/2003 | Mills et al. |
| 6,678,788 B1 | 1/2004 | O'Connell |
| 6,757,768 B1 | 6/2004 | Potter et al. |
| 6,775,792 B2 | 8/2004 | Ulrich et al. |
| 6,810,440 B2 | 10/2004 | Micalizzi, JR. et al. |
| 6,836,808 B2 | 12/2004 | Bunce et al. |
| 6,836,815 B1 | 12/2004 | Purcell et al. |
| 6,842,436 B2 | 1/2005 | Moeller |
| 6,865,650 B1 | 3/2005 | Morley et al. |
| 6,871,257 B2 | 3/2005 | Conley et al. |
| 6,895,464 B2 | 5/2005 | Chow et al. |
| 6,966,006 B2 | 11/2005 | Pacheco et al. |
| 6,978,343 B1 | 12/2005 | Ichiriu |
| 6,980,985 B1 | 12/2005 | Amer-Yahia et al. |
| 6,981,205 B2 | 12/2005 | Fukushima et al. |
| 6,988,171 B2 | 1/2006 | Beardsley et al. |
| 7,020,017 B2 | 3/2006 | Chen et al. |
| 7,028,165 B2 | 4/2006 | Roth et al. |
| 7,032,123 B2 | 4/2006 | Kane et al. |
| 7,043,505 B1 | 5/2006 | Teague et al. |
| 7,076,598 B2 | 7/2006 | Wang |
| 7,100,002 B2 | 8/2006 | Shrader |
| 7,102,860 B2 * | 9/2006 | Wenzel ............... G05F 1/569 370/140 |
| 7,111,293 B1 | 9/2006 | Hersh et al. |
| 7,126,873 B2 | 10/2006 | See et al. |
| 7,133,282 B2 | 11/2006 | Sone |
| 7,162,678 B2 | 1/2007 | Saliba |
| 7,173,852 B2 | 2/2007 | Gorobets et al. |
| 7,184,446 B2 | 2/2007 | Rashid et al. |
| 7,275,170 B2 * | 9/2007 | Suzuki ............... G06F 1/3203 713/300 |
| 7,328,377 B1 | 2/2008 | Lewis et al. |
| 7,516,292 B2 | 4/2009 | Kimura et al. |
| 7,523,157 B2 | 4/2009 | Aguilar, JR. et al. |
| 7,527,466 B2 | 5/2009 | Simmons |
| 7,529,466 B2 | 5/2009 | Takahashi |
| 7,533,214 B2 | 5/2009 | Aasheim et al. |
| 7,546,478 B2 * | 6/2009 | Kubo .................. G06F 1/26 710/10 |
| 7,566,987 B2 | 7/2009 | Black et al. |
| 7,571,277 B2 | 8/2009 | Mizushima |
| 7,574,554 B2 | 8/2009 | Tanaka et al. |
| 7,596,643 B2 | 9/2009 | Merry, Jr. et al. |
| 7,681,106 B2 | 3/2010 | Jarrar et al. |
| 7,685,494 B1 | 3/2010 | Varnica et al. |
| 7,707,481 B2 | 4/2010 | Kirschner et al. |
| 7,761,655 B2 | 7/2010 | Mizushima et al. |
| 7,765,454 B2 | 7/2010 | Passint |
| 7,774,390 B2 | 8/2010 | Shin |
| 7,840,762 B2 | 11/2010 | Oh et al. |
| 7,870,326 B2 | 1/2011 | Shin et al. |
| 7,890,818 B2 | 2/2011 | Kong et al. |
| 7,913,022 B1 | 3/2011 | Baxter |
| 7,925,960 B2 | 4/2011 | Ho et al. |
| 7,934,052 B2 | 4/2011 | Prins et al. |
| 7,945,825 B2 | 5/2011 | Cohen et al. |
| 7,954,041 B2 | 5/2011 | Hong et al. |
| 7,971,112 B2 | 6/2011 | Murata |
| 7,974,368 B2 | 7/2011 | Shieh et al. |
| 7,978,516 B2 | 7/2011 | Olbrich et al. |
| 7,996,642 B1 | 8/2011 | Smith |
| 8,006,161 B2 | 8/2011 | Lestable et al. |
| 8,032,724 B1 | 10/2011 | Smith |
| 8,041,884 B2 | 10/2011 | Chang |
| 8,042,011 B2 | 10/2011 | Nicolaidis et al. |
| 8,069,390 B2 | 11/2011 | Lin |
| 8,190,967 B2 | 5/2012 | Hong et al. |
| 8,250,380 B2 | 8/2012 | Guyot |
| 8,254,181 B2 | 8/2012 | Hwang et al. |
| 8,259,506 B1 | 9/2012 | Sommer et al. |
| 8,312,349 B2 | 11/2012 | Reche et al. |
| 8,412,985 B1 | 4/2013 | Bowers et al. |
| 8,429,436 B2 | 4/2013 | Fillingim et al. |
| 8,438,459 B2 | 5/2013 | Cho et al. |
| 8,453,022 B2 | 5/2013 | Katz |
| 8,627,117 B2 * | 1/2014 | Johnston ............ G06F 1/26 711/103 |
| 8,634,248 B1 | 1/2014 | Sprouse et al. |
| 8,694,854 B1 | 4/2014 | Dar et al. |
| 8,724,789 B2 | 5/2014 | Altberg et al. |
| 8,885,434 B2 | 11/2014 | Kumar |
| 8,898,373 B1 | 11/2014 | Kang et al. |
| 8,910,030 B2 | 12/2014 | Goel |
| 8,923,066 B1 | 12/2014 | Subramanian et al. |
| 9,128,690 B2 * | 9/2015 | Lotzenburger ........ G06F 1/266 1/1 |
| 2001/0050824 A1 | 12/2001 | Buch |
| 2002/0024846 A1 | 2/2002 | Kawahara et al. |
| 2002/0036515 A1 * | 3/2002 | Eldridge ........... G01R 31/31721 324/762.03 |
| 2002/0083299 A1 | 6/2002 | Van Huben et al. |
| 2002/0122334 A1 | 9/2002 | Lee et al. |
| 2002/0152305 A1 | 10/2002 | Jackson et al. |
| 2002/0162075 A1 | 10/2002 | Talagala et al. |
| 2002/0165896 A1 | 11/2002 | Kim |
| 2003/0041299 A1 | 2/2003 | Kanazawa et al. |
| 2003/0043829 A1 | 3/2003 | Rashid et al. |
| 2003/0079172 A1 | 4/2003 | Yamagishi et al. |
| 2003/0088805 A1 | 5/2003 | Majni et al. |
| 2003/0093628 A1 | 5/2003 | Matter et al. |
| 2003/0163594 A1 | 8/2003 | Aasheim et al. |
| 2003/0163629 A1 | 8/2003 | Conley et al. |
| 2003/0188045 A1 | 10/2003 | Jacobson |
| 2003/0189856 A1 | 10/2003 | Cho et al. |
| 2003/0198100 A1 | 10/2003 | Matsushita et al. |
| 2003/0204341 A1 | 10/2003 | Guliani et al. |
| 2003/0212719 A1 | 11/2003 | Yasuda et al. |
| 2004/0024957 A1 | 2/2004 | Lin et al. |
| 2004/0024963 A1 | 2/2004 | Talagala et al. |
| 2004/0057575 A1 | 3/2004 | Zhang et al. |
| 2004/0062157 A1 | 4/2004 | Kawabe |
| 2004/0073829 A1 | 4/2004 | Olarig |
| 2004/0114265 A1 | 6/2004 | Talbert |
| 2004/0143710 A1 | 7/2004 | Walmsley |
| 2004/0148561 A1 | 7/2004 | Shen et al. |
| 2004/0153902 A1 | 8/2004 | Machado et al. |
| 2004/0167898 A1 | 8/2004 | Margolus et al. |
| 2004/0181734 A1 | 9/2004 | Saliba |

(56) References Cited

U.S. PATENT DOCUMENTS

| | | |
|---|---|---|
| 2004/0199714 A1 | 10/2004 | Estakhri et al. |
| 2004/0237018 A1 | 11/2004 | Riley |
| 2005/0060456 A1 | 3/2005 | Shrader et al. |
| 2005/0060501 A1 | 3/2005 | Shrader |
| 2005/0073884 A1 | 4/2005 | Gonzalez et al. |
| 2005/0108588 A1 | 5/2005 | Yuan |
| 2005/0114587 A1 | 5/2005 | Chou et al. |
| 2005/0172065 A1 | 8/2005 | Keays |
| 2005/0172207 A1 | 8/2005 | Radke et al. |
| 2005/0193161 A1 | 9/2005 | Lee et al. |
| 2005/0201148 A1 | 9/2005 | Chen et al. |
| 2005/0231765 A1 | 10/2005 | So et al. |
| 2005/0249013 A1 | 11/2005 | Janzen et al. |
| 2005/0251617 A1 | 11/2005 | Sinclair et al. |
| 2005/0257120 A1 | 11/2005 | Gorobets et al. |
| 2005/0273560 A1 | 12/2005 | Hulbert et al. |
| 2005/0289314 A1 | 12/2005 | Adusumilli et al. |
| 2006/0010174 A1 | 1/2006 | Nguyen et al. |
| 2006/0039196 A1 | 2/2006 | Gorobets et al. |
| 2006/0039227 A1 | 2/2006 | Lai et al. |
| 2006/0053246 A1 | 3/2006 | Lee |
| 2006/0085671 A1 | 4/2006 | Majni et al. |
| 2006/0087893 A1 | 4/2006 | Nishihara et al. |
| 2006/0107181 A1 | 5/2006 | Dave et al. |
| 2006/0136570 A1 | 6/2006 | Pandya |
| 2006/0136681 A1 | 6/2006 | Jain et al. |
| 2006/0156177 A1 | 7/2006 | Kottapalli et al. |
| 2006/0195650 A1 | 8/2006 | Su et al. |
| 2006/0244049 A1 | 11/2006 | Yaoi et al. |
| 2006/0259528 A1 | 11/2006 | Dussud et al. |
| 2006/0291301 A1 | 12/2006 | Ziegelmayer |
| 2007/0011413 A1 | 1/2007 | Nonaka et al. |
| 2007/0058446 A1 | 3/2007 | Hwang et al. |
| 2007/0061597 A1 | 3/2007 | Holtzman et al. |
| 2007/0076479 A1 | 4/2007 | Kim et al. |
| 2007/0081408 A1 | 4/2007 | Kwon et al. |
| 2007/0083697 A1 | 4/2007 | Birrell et al. |
| 2007/0088716 A1 | 4/2007 | Brumme et al. |
| 2007/0091677 A1 | 4/2007 | Lasser et al. |
| 2007/0113019 A1 | 5/2007 | Beukema et al. |
| 2007/0133312 A1 | 6/2007 | Roohparvar |
| 2007/0147113 A1 | 6/2007 | Mokhlesi et al. |
| 2007/0150790 A1 | 6/2007 | Gross et al. |
| 2007/0156842 A1 | 7/2007 | Vermeulen et al. |
| 2007/0157064 A1 | 7/2007 | Falik et al. |
| 2007/0174579 A1 | 7/2007 | Shin |
| 2007/0180188 A1 | 8/2007 | Fujibayashi et al. |
| 2007/0180346 A1 | 8/2007 | Murin |
| 2007/0201274 A1 | 8/2007 | Yu et al. |
| 2007/0208901 A1 | 9/2007 | Purcell et al. |
| 2007/0234143 A1 | 10/2007 | Kim |
| 2007/0245061 A1 | 10/2007 | Harriman |
| 2007/0245099 A1 | 10/2007 | Gray et al. |
| 2007/0263442 A1 | 11/2007 | Cornwall et al. |
| 2007/0277036 A1 | 11/2007 | Chamberlain et al. |
| 2007/0279988 A1 | 12/2007 | Nguyen |
| 2007/0291556 A1 | 12/2007 | Kamei |
| 2007/0294496 A1 | 12/2007 | Goss et al. |
| 2007/0300130 A1 | 12/2007 | Gorobets |
| 2008/0013390 A1 | 1/2008 | Zipprich-Rasch |
| 2008/0019182 A1 | 1/2008 | Yanagidaira et al. |
| 2008/0022163 A1 | 1/2008 | Tanaka et al. |
| 2008/0028275 A1 | 1/2008 | Chen et al. |
| 2008/0043871 A1 | 2/2008 | Latouche et al. |
| 2008/0052446 A1 | 2/2008 | Lasser et al. |
| 2008/0056005 A1 | 3/2008 | Aritome |
| 2008/0071971 A1 | 3/2008 | Kim et al. |
| 2008/0077841 A1 | 3/2008 | Gonzalez et al. |
| 2008/0077937 A1 | 3/2008 | Shin et al. |
| 2008/0086677 A1 | 4/2008 | Yang et al. |
| 2008/0112226 A1 | 5/2008 | Mokhlesi |
| 2008/0141043 A1 | 6/2008 | Flynn et al. |
| 2008/0144371 A1 | 6/2008 | Yeh et al. |
| 2008/0147714 A1 | 6/2008 | Breternitz et al. |
| 2008/0147964 A1 | 6/2008 | Chow et al. |
| 2008/0147998 A1 | 6/2008 | Jeong |
| 2008/0148124 A1 | 6/2008 | Zhang et al. |
| 2008/0163030 A1 | 7/2008 | Lee |
| 2008/0168191 A1 | 7/2008 | Biran et al. |
| 2008/0168319 A1 | 7/2008 | Lee et al. |
| 2008/0170460 A1 | 7/2008 | Oh et al. |
| 2008/0229000 A1 | 9/2008 | Kim |
| 2008/0229003 A1 | 9/2008 | Mizushima et al. |
| 2008/0229176 A1 | 9/2008 | Arnez et al. |
| 2008/0270680 A1 | 10/2008 | Chang |
| 2008/0282128 A1 | 11/2008 | Lee et al. |
| 2008/0285351 A1 | 11/2008 | Shlick et al. |
| 2008/0313132 A1 | 12/2008 | Hao et al. |
| 2009/0003058 A1 | 1/2009 | Kang |
| 2009/0019216 A1 | 1/2009 | Yamada et al. |
| 2009/0031083 A1 | 1/2009 | Willis et al. |
| 2009/0037652 A1 | 2/2009 | Yu et al. |
| 2009/0070608 A1* | 3/2009 | Kobayashi ............ G06F 1/3203 713/320 |
| 2009/0116283 A1 | 5/2009 | Ha et al. |
| 2009/0125671 A1 | 5/2009 | Flynn et al. |
| 2009/0144598 A1 | 6/2009 | Yoon et al. |
| 2009/0168525 A1 | 7/2009 | Olbrich et al. |
| 2009/0172258 A1 | 7/2009 | Olbrich et al. |
| 2009/0172259 A1 | 7/2009 | Prins et al. |
| 2009/0172260 A1 | 7/2009 | Olbrich et al. |
| 2009/0172261 A1 | 7/2009 | Prins et al. |
| 2009/0172262 A1 | 7/2009 | Olbrich et al. |
| 2009/0172308 A1 | 7/2009 | Prins et al. |
| 2009/0172335 A1 | 7/2009 | Kulkarni et al. |
| 2009/0172499 A1 | 7/2009 | Olbrich et al. |
| 2009/0193058 A1 | 7/2009 | Reid |
| 2009/0207660 A1 | 8/2009 | Hwang et al. |
| 2009/0213649 A1 | 8/2009 | Takahashi et al. |
| 2009/0222708 A1 | 9/2009 | Yamaga |
| 2009/0228761 A1 | 9/2009 | Perlmutter et al. |
| 2009/0249160 A1 | 10/2009 | Gao et al. |
| 2009/0268521 A1 | 10/2009 | Ueno et al. |
| 2009/0292972 A1 | 11/2009 | Seol et al. |
| 2009/0296466 A1 | 12/2009 | Kim et al. |
| 2009/0296486 A1 | 12/2009 | Kim et al. |
| 2009/0310422 A1 | 12/2009 | Edahiro et al. |
| 2009/0319864 A1 | 12/2009 | Shrader |
| 2010/0002506 A1 | 1/2010 | Cho et al. |
| 2010/0008175 A1 | 1/2010 | Sweere et al. |
| 2010/0011261 A1 | 1/2010 | Cagno et al. |
| 2010/0020620 A1 | 1/2010 | Kim et al. |
| 2010/0037012 A1 | 2/2010 | Yano et al. |
| 2010/0061151 A1 | 3/2010 | Miwa et al. |
| 2010/0091535 A1 | 4/2010 | Sommer et al. |
| 2010/0103737 A1 | 4/2010 | Park |
| 2010/0110798 A1 | 5/2010 | Hoei et al. |
| 2010/0118608 A1 | 5/2010 | Song et al. |
| 2010/0138592 A1 | 6/2010 | Cheon |
| 2010/0153616 A1 | 6/2010 | Garratt |
| 2010/0161936 A1 | 6/2010 | Royer et al. |
| 2010/0174959 A1 | 7/2010 | No et al. |
| 2010/0199125 A1 | 8/2010 | Reche |
| 2010/0199138 A1 | 8/2010 | Rho |
| 2010/0202196 A1 | 8/2010 | Lee et al. |
| 2010/0208521 A1 | 8/2010 | Kim et al. |
| 2010/0262889 A1 | 10/2010 | Bains |
| 2010/0281207 A1 | 11/2010 | Miller et al. |
| 2010/0281342 A1 | 11/2010 | Chang et al. |
| 2010/0332858 A1* | 12/2010 | Trantham ................ G06F 1/30 713/300 |
| 2011/0010514 A1 | 1/2011 | Benhase et al. |
| 2011/0051513 A1 | 3/2011 | Shen et al. |
| 2011/0066597 A1 | 3/2011 | Mashtizadeh et al. |
| 2011/0072302 A1 | 3/2011 | Sartore |
| 2011/0078407 A1 | 3/2011 | Lewis |
| 2011/0083060 A1 | 4/2011 | Sakurada et al. |
| 2011/0099460 A1 | 4/2011 | Dusija et al. |
| 2011/0113281 A1 | 5/2011 | Zhang et al. |
| 2011/0122691 A1 | 5/2011 | Sprouse |
| 2011/0131444 A1 | 6/2011 | Buch et al. |
| 2011/0138260 A1 | 6/2011 | Savin |
| 2011/0173378 A1 | 7/2011 | Filor et al. |
| 2011/0179249 A1 | 7/2011 | Hsiao |

(56) References Cited

U.S. PATENT DOCUMENTS

| | | |
|---|---|---|
| 2011/0199825 A1 | 8/2011 | Han et al. |
| 2011/0205823 A1 | 8/2011 | Hemink et al. |
| 2011/0213920 A1 | 9/2011 | Frost et al. |
| 2011/0222342 A1 | 9/2011 | Yoon et al. |
| 2011/0225346 A1 | 9/2011 | Goss et al. |
| 2011/0228601 A1 | 9/2011 | Olbrich et al. |
| 2011/0231600 A1 | 9/2011 | Tanaka et al. |
| 2011/0239077 A1 | 9/2011 | Bai et al. |
| 2011/0264843 A1 | 10/2011 | Haines et al. |
| 2011/0271040 A1 | 11/2011 | Kamizono |
| 2011/0283119 A1 * | 11/2011 | Szu ............ G06F 1/26 713/300 |
| 2012/0023144 A1 | 1/2012 | Rub |
| 2012/0054414 A1 | 3/2012 | Tsai et al. |
| 2012/0063234 A1 | 3/2012 | Shiga et al. |
| 2012/0072639 A1 | 3/2012 | Goss et al. |
| 2012/0096217 A1 | 4/2012 | Son et al. |
| 2012/0110250 A1 | 5/2012 | Sabbag et al. |
| 2012/0117317 A1 | 5/2012 | Sheffler |
| 2012/0151124 A1 | 6/2012 | Baek et al. |
| 2012/0151253 A1 | 6/2012 | Horn |
| 2012/0151294 A1 | 6/2012 | Yoo et al. |
| 2012/0173797 A1 | 7/2012 | Shen |
| 2012/0185750 A1 | 7/2012 | Hayami |
| 2012/0195126 A1 | 8/2012 | Roohparvar |
| 2012/0203951 A1 | 8/2012 | Wood et al. |
| 2012/0216079 A1 | 8/2012 | Fai et al. |
| 2012/0233391 A1 | 9/2012 | Frost et al. |
| 2012/0236658 A1 | 9/2012 | Byom et al. |
| 2012/0239858 A1 | 9/2012 | Melik-Martirosian |
| 2012/0239976 A1 | 9/2012 | Cometti et al. |
| 2012/0259863 A1 | 10/2012 | Bodwin et al. |
| 2012/0275466 A1 | 11/2012 | Bhadra et al. |
| 2012/0278564 A1 | 11/2012 | Goss et al. |
| 2012/0284574 A1 | 11/2012 | Avila et al. |
| 2012/0284587 A1 | 11/2012 | Yu et al. |
| 2013/0007073 A1 | 1/2013 | Varma |
| 2013/0007343 A1 | 1/2013 | Rub et al. |
| 2013/0007543 A1 | 1/2013 | Goss et al. |
| 2013/0024735 A1 | 1/2013 | Chung et al. |
| 2013/0031438 A1 | 1/2013 | Hu et al. |
| 2013/0036418 A1 | 2/2013 | Yadappanavar et al. |
| 2013/0047045 A1 | 2/2013 | Hu et al. |
| 2013/0073924 A1 | 3/2013 | D'Abreu et al. |
| 2013/0079942 A1 | 3/2013 | Smola et al. |
| 2013/0086131 A1 | 4/2013 | Hunt et al. |
| 2013/0086132 A1 | 4/2013 | Hunt et al. |
| 2013/0094288 A1 | 4/2013 | Patapoutian et al. |
| 2013/0111279 A1 | 5/2013 | Jeon et al. |
| 2013/0111298 A1 | 5/2013 | Seroff et al. |
| 2013/0121084 A1 | 5/2013 | Jeon et al. |
| 2013/0124888 A1 | 5/2013 | Tanaka et al. |
| 2013/0128666 A1 | 5/2013 | Avila et al. |
| 2013/0132652 A1 | 5/2013 | Wood et al. |
| 2013/0176784 A1 | 7/2013 | Cometti et al. |
| 2013/0179646 A1 | 7/2013 | Okubo et al. |
| 2013/0191601 A1 | 7/2013 | Peterson et al. |
| 2013/0194874 A1 | 8/2013 | Mu et al. |
| 2013/0232289 A1 | 9/2013 | Zhong et al. |
| 2013/0254507 A1 | 9/2013 | Islam et al. |
| 2013/0258738 A1 | 10/2013 | Barkon et al. |
| 2013/0265838 A1 | 10/2013 | Li |
| 2013/0282955 A1 | 10/2013 | Parker et al. |
| 2013/0290611 A1 | 10/2013 | Biederman et al. |
| 2013/0301373 A1 | 11/2013 | Tam |
| 2013/0304980 A1 | 11/2013 | Nachimuthu et al. |
| 2013/0343131 A1 | 12/2013 | Wu et al. |
| 2014/0013188 A1 | 1/2014 | Wu et al. |
| 2014/0063905 A1 | 3/2014 | Ahn et al. |
| 2014/0075133 A1 | 3/2014 | Li et al. |
| 2014/0082261 A1 | 3/2014 | Cohen et al. |
| 2014/0082456 A1 | 3/2014 | Li et al. |
| 2014/0095775 A1 | 4/2014 | Talagala et al. |
| 2014/0122818 A1 | 5/2014 | Hayasaka et al. |
| 2014/0136883 A1 | 5/2014 | Cohen |
| 2014/0136927 A1 | 5/2014 | Li et al. |
| 2014/0143505 A1 | 5/2014 | Sim et al. |
| 2014/0201596 A1 | 7/2014 | Baum et al. |
| 2014/0223084 A1 | 8/2014 | Lee et al. |
| 2014/0258755 A1 | 9/2014 | Stenfort |
| 2014/0269090 A1 | 9/2014 | Flynn et al. |
| 2014/0359381 A1 | 12/2014 | Takeuchi et al. |
| 2015/0153799 A1 | 6/2015 | Lucas et al. |

FOREIGN PATENT DOCUMENTS

| | | |
|---|---|---|
| EP | 1 990 921 A2 | 11/2008 |
| EP | 2 386 958 A1 | 11/2011 |
| EP | 2 620 946 A2 | 7/2013 |
| JP | 2002-532806 S | 10/2002 |
| WO | WO 2007/036834 A2 | 4/2007 |
| WO | WO 2007/080586 A2 | 7/2007 |
| WO | WO 2008/075292 | 6/2008 |
| WO | WO 2008/121553 A1 | 10/2008 |
| WO | WO 2008/121577 A1 | 10/2008 |
| WO | WO 2009/028281 A1 | 3/2009 |
| WO | WO 2009/032945 A1 | 3/2009 |
| WO | WO 2009/058140 A1 | 5/2009 |
| WO | WO 2009/084724 | 7/2009 |
| WO | WO 2009/134576 A1 | 11/2009 |
| WO | WO 2011/024015 | 3/2011 |

OTHER PUBLICATIONS

International Search Report and Written Opinion dated Jan. 21, 2015, received in International Application No. PCT/US2014/059748, which corresponds to U.S. Appl. No. 14/137,511, 13 pages (Dancho).

International Search Report and Written Opinion dated Feb. 18, 2015, received in International Application No. PCT/US2014/066921, which corresponds to U.S. Appl. No. 14/135,260, 13 pages (Fitzpatrick).

Ashkenazi et al., "Platform independent overall security architecture in multi-processor system-on-chip integrated circuits for use in mobile phones and handheld devices," ScienceDirect, Computers and Electrical Engineering 33 (2007), 18 pages.

Lee et al., "A Semi-Preemptive Garbage Collector for Solid State Drives," Apr. 2011, IEEE, pp. 12-21.

Office Action dated Feb. 17, 2015, received in Chinese Patent Application No. 201210334987.1, which corresponds to U.S. Appl. No. 12/082,207, 9 pages (Prins).

International Search Report and Written Opinion dated May 4, 2015, received in International Patent Application No. PCT/US2014/065987, which corresponds to U.S. Appl. No. 14/135,400, 12 pages (George).

International Search Report and Written Opinion dated Mar. 17. 2015, received in International Patent Application No. PCT/US2014/067467, which corresponds to U.S. Appl. No. 14/135,420, 13 pages (Lucas).

International Search Report and Written Opinion dated Apr. 20, 2015, received in International Patent Application No. PCT/US2014/063949, which corresponds to U.S. Appl. No. 14/135,433, 21 pages (Delpapa).

International Search Report and Written Opinion dated Mar. 9, 2015, received in International Patent Application No. PCT/US2014/059747, which corresponds to U.S. Appl. No. 14/137,440, 9 pages (Fitzpatrick).

International Search Report and Written Opinion dated Jul. 25, 2014, received in International Patent Application No. PCT/US2014/029453, which corresponds to U.S. Appl. No. 13/963,444, 9 pages (Frayer).

International Search Report and Written Opinion dated Mar. 7, 2014, received in International Patent Application No. PCT/US2013/074772, which corresponds to U.S. Appl. No. 13/831,218, 10 pages (George).

International Search Report and Written Opinion dated Mar. 24, 2014, received in International Patent Application No. PCT/US2013/074777, which corresponds to U.S. Appl. No. 13/831,308, 10 pages (George).

International Search Report and Written Opinion dated Mar. 7, 2014, received in International Patent Application No. PCT/US2013/

(56) References Cited

OTHER PUBLICATIONS 074779, which corresponds to U.S. Appl. No. 13/831,374, 8 pages (George).
Barr, Introduction to Watchdog Timers, Oct. 2001, 3 pgs.
Canim, Buffered Bloom ilters on Solid State Storage, ADMS*10, Singapore, Sep. 13-17, 2010, 8 pgs.
Kang, A Multi-Channel Architecture for High-Performance NAND Flash-Based Storage System, J. Syst. Archit., 53, 9, Sep. 2007, 15 pgs.
Kim, A Space-Efficient Flash Translation Layer for CompactFlash Systems, May 2002, 10 pgs.
Lu, A Forest-structured Bloom Filter with Flash Memory, MSST 2011, Denver, CO, May 23-27, 2011, article, 6 pgs.
Lu, A Forest-structured Bloom Filter with Flash Memory, MSST 2011, Denver, CO, May 23-27, 2011, presentation slides, 25 pgs.
McLean, Information Technology—AT Attachment with Packet Interface Extension, Aug. 19, 1998, 339 pgs.
Park, A High Performance Controller for NAND Flash-Based Solid State Disk (NSSD), Feb. 12-16, 2006, 4 pgs.
Pliant Technology, International Search Report / Written Opinion, PCT/US08/88133, Mar. 19, 2009, 7 pgs.
Pliant Technology, International Search Report / Written Opinion, PCT/US08/88136, Mar. 19, 2009, 7 pgs.
Pliant Technology, International Search Report / Written Opinion, PCT/US08/88146, Feb. 26, 2009, 10 pgs.
Pliant Technology, International Search Report / Written Opinion, PCT/US08/88154, Feb. 27, 2009, 8 pgs.
Pliant Technology, International Search Report / Written Opinion, PCT/US08/88164, Feb. 13, 2009, 6 pgs.
Pliant Technology, International Search Report / Written Opinion, PCT/US08/88206, Feb. 18, 2009, 8 pgs.
Pliant Technology, International Search Report / Written Opinion, PCT/US08/88217, Feb. 19, 2009, 7 pgs.
Pliant Technology, International Search Report / Written Opinion, PCT/US08/88229, Feb. 13, 2009, 7 pgs.
Pliant Technology, International Search Report / Written Opinion, PCT/US08/88232, Feb. 19, 2009, 8 pgs.
Pliant Technology, International Search Report / Written Opinion, PCT/US08/88236, Feb. 19, 2009, 7 pgs.
Pliant Technology, International Search Report / Written Opinion, PCT/US2011/028637, Oct. 27, 2011, 11 pgs.
Pliant Technology, Supplementary ESR, 08866997.3, Feb. 23, 2012, 6 pgs.
SanDisk Enterprise IP LLC, International Search Report / Written Opinion, PCT/US2012/042764, Aug. 31, 2012, 12 pgs.
SanDisk Enterprise IP LLC, International Search Report / Written Opinion, PCT/US2012/042771, Mar. 4, 2013, 14 pgs.
SanDisk Enterprise IP LLC, International Search Report / Written Opinion, PCT/US2012/042775, Sep. 26, 2012, 8 pgs.
SanDisk Enterprise IP LLC, International Search Report / Written Opinion, PCT/US2012/059447, Jun. 6, 2013, 12 pgs.
SanDisk Enterprise IP LLC, International Search Report / Written Opinion, PCT/US2012/059453, Jun. 6, 2013, 12 pgs.
Sandisk Enterprise IP LLC, International Search Report / Written Opinion, PCT/US2012/059459, Feb. 14, 2013, 9 pgs.
SanDisk Enterprise IP LLC, International Search Report / Written Opinion, PCT/US2012/065914, May 23, 2013, 7 pgs.
SanDisk Enterprise IP LLC, International Search Report / Written Opinion, PCT/US2012/065916, Apr. 5, 2013, 7 pgs.
SanDisk Enterprise IP LLC, International Search Report / Written Opinion, PCT/US2012/065919, Jun. 17, 2013, 8 pgs.
SanDisk Enterprise IP LLC, Notification of the Decision to Grant a Patent Right for Patent for Invention, CN 200880127623.8, Jul. 4, 2013, 1 pg.
SanDisk Enterprise IP LLC, Office Action, CN 200880127623.8, Apr. 18, 2012, 12 pgs.
SanDisk Enterprise IP LLC, Office Action, CN 200880127623.8, Dec. 31, 2012, 9 pgs.
SanDisk Enterprise IP LLC, Office Action, JP 2010-540863, Jul. 24, 2012, 3 pgs.
Watchdog Timer and Power Savin Modes, Microchip Technology Inc., 2005, 14 pgs.
Zeidman, 1999 Verilog Designer's Library, 9 pgs.
Bayer, "Prefix B-Trees", IP.com Journal, IP.com Inc., West Henrietta, NY, Mar. 30, 2007, 29 pages.
Bhattacharjee et al., "Efficient Index Compression in DB2 LUW", IBM Research Report, Jun. 23, 2009, http://domino.research.ibm.com/library/cyberdig.nsf/papers/40B2C45876D0D747852575E100620CE7/$File/rc24815.pdf, 13 pages.
Oracle, "Oracle9i: Database Concepts", Jul. 2001, http://docs.oracle.com/cd/A91202_01/901_doc/server.901/a88856.pdf, 49 pages.
International Search Report and Written Opinion dated Jun. 8, 2015, received in International Patent Application No. PCT/US2015/018252, which corresponds to U.S. Appl. No. 14/339,072, 9 pages (Busch).
International Search Report and Written Opinion dated Jun. 2, 2015, received in International Patent Application No. PCT/US2015/018255, which corresponds to U.S. Appl. No. 14/336,967, 14 pages (Chander).
International Search Report and Written Opinion dated Jun. 30, 2015, received in International Patent Application No. PCT/US2015/023927, which corresponds to U.S. Appl. No. 14/454,687, 11 pages (Kadayam).
International Search Report and Written Opinion dated Jul. 23, 2015, received in International Patent Application No. PCT/US2015/030850, which corresponds to U.S. Appl. No. 14/298,843, 12 pages (Ellis).
International Search Report and Written Opinion dated Sep. 14, 2015, received in International Patent Application No. PCT/US2015/036807, which corresponds to U.S. Appl. No. 14/311,152, 9 pages (Higgins).

* cited by examiner

STARTUP PERFORMANCE AND POWER ISOLATION

RELATED APPLICATIONS

This application claims priority to U.S. Provisional Patent Application No. 61/911,933, filed Dec. 4, 2013, which is hereby incorporated by reference in its entirety.

TECHNICAL FIELD

The disclosed embodiments relate generally to memory systems, and in particular, to power inrush management and startup performance of storage devices (e.g., dual in-line memory module (DIMM) devices).

BACKGROUND

Semiconductor memory devices, including flash memory, typically utilize memory cells to store data as an electrical value, such as an electrical charge or voltage. A flash memory cell, for example, includes a single transistor with a floating gate that is used to store a charge representative of a data value. Flash memory is a non-volatile data storage device that can be electrically erased and reprogrammed. More generally, non-volatile memory (e.g., flash memory, as well as other types of non-volatile memory implemented using any of a variety of technologies) retains stored information even when not powered, as opposed to volatile memory, which requires power to maintain the stored information.

Data hardening, the saving of data and mission critical metadata held in volatile storage, is an integral part of a storage device. When there is a power failure, mission critical data may reside in volatile memory in a number of sub-system components. Coordinating and managing multiple sub-system components to ensure that volatile data is saved successfully is important for safeguarding data integrity of a storage device. Storage devices with data hardening functionality sometimes use energy storage devices (e.g., holdup capacitor banks) to store energy for later use, if and when input power is lost. In these devices, power management is important to manage power demands on the host system during power-on conditions.

SUMMARY

Various implementations of systems, methods and devices within the scope of the appended claims each have several aspects, no single one of which is solely responsible for the attributes described herein. Without limiting the scope of the appended claims, after considering this disclosure, and particularly after considering the section entitled "Detailed Description" one will understand how the aspects of various implementations are used to enable power inrush management and startup performance of storage devices (e.g., DIMM devices). In one aspect, a storage device is configured to: (1) power the PCP using a first input voltage, (2) while the PCP is powered using the first input voltage: (a) operate the PCP in a first mode, and (b) charge an energy storage device, (3) after achieving a predefined internal state, which includes the energy storage device charged to a predefined level, power the PCP using a power supply voltage distinct from the first input voltage, and (4) while the PCP is powered using the power supply voltage, operate the PCP in a second mode, where the PCP operates at a higher performance level in the second mode than in the first mode.

BRIEF DESCRIPTION OF THE DRAWINGS

So that the present disclosure can be understood in greater detail, a more particular description may be had by reference to the features of various implementations, some of which are illustrated in the appended drawings. The appended drawings, however, merely illustrate the more pertinent features of the present disclosure and are therefore not to be considered limiting, for the description may admit to other effective features.

Figure 1:
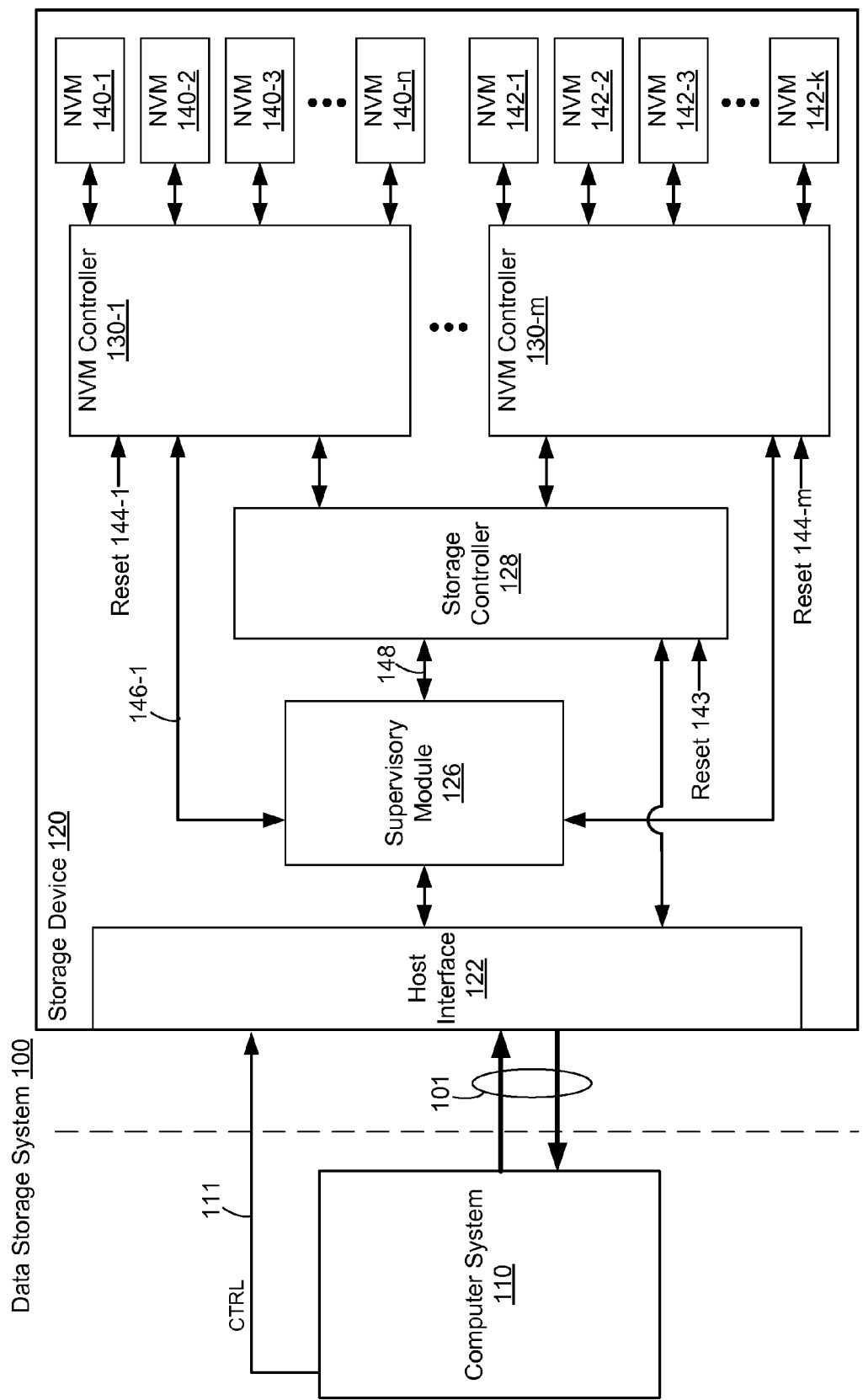
FIG. 1 is a block diagram illustrating an implementation of a data storage system, in accordance with some embodiments.

In accordance with common practice the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DETAILED DESCRIPTION

The various implementations described herein include systems, methods and/or devices used for power inrush and startup performance management in storage devices. Some implementations include systems, methods and/or devices to perform a power management operation.

More specifically, some implementations include a method of power management in a storage device. In some implementations, the method includes (1) powering a power control processor (PCP) (also sometimes called a storage-level microcontroller) using a first input voltage, (2) while the PCP is powered using the first input voltage: (a) operating the PCP in a first mode, and (b) enabling charging of an energy storage device, (3) after achieving a predefined internal state, which includes the energy storage device charged to a predefined level, powering the PCP using a power supply voltage distinct from the first input voltage, and (4) while the PCP is powered using the power supply voltage, operating the PCP in a second mode, where the PCP operates at a higher performance level in the second mode than in the first mode.

In some embodiments, operating at a higher performance level includes operating at a higher frequency.

In some embodiments, the first input voltage corresponds to a low power communication bus.

In some embodiments, while operating in the first mode, the PCP detects presence of components of the storage device.

In some embodiments, achieving the predefined internal state further includes completing a predefined start-up routine.

In some embodiments, while operating in the second mode, the PCP initiates operation of a plurality of power regulators on the storage device.

In some embodiments, while operating in the first mode, the PCP enables power to a plurality of power regulators on the storage device.

In some embodiments, the plurality of power regulators supply power to a plurality of controllers on the storage device.

In some embodiments, while operating in the second mode, the PCP enables power to a plurality of controllers on the storage device.

In some embodiments, while operating in the second mode, the PCP initiates normal operation of the storage device.

In some embodiments, while being powered using the first input voltage, the PCP is incapable of sustained operation at said higher performance level.

In some embodiments, the energy storage device comprises one or more capacitors.

In some embodiments, the power supply voltage is generated from a second input voltage.

In some embodiments, the energy storage device is charged using a second input voltage.

In some embodiments, the method further includes, prior to charging the energy storage device, monitoring the second input voltage to determine whether the second input voltage stays within predetermined boundaries.

In some embodiments, the second input voltage corresponds to a normal power bus.

In some embodiments, the second input voltage is insufficient to power the PCP directly.

In some embodiments, the method further includes, while the PCP is powered using the first input voltage: (1) detecting a unique location associated with the storage device; (2) determining a time delay for the storage device in accordance with the unique location; and (3) delaying at least one operation of the PCP by the determined time delay.

In another aspect, any of the methods described above are performed by a storage device comprising (1) an interface for coupling the storage device to a host system, (2) an energy storage device and (3) a power control processor (PCP), the storage device configured to: (1) power the PCP using a first input voltage; (2) while the PCP is powered using the first input voltage: (a) operate the PCP in a first mode; and (b) charge an energy storage device; (3) after achieving a predefined internal state, which includes the energy storage device charged to a predefined level, power the PCP using a power supply voltage distinct from the first input voltage; and (4) while the PCP is powered using the power supply voltage, operate the PCP in a second mode, where the PCP operates at a higher performance level in the second mode than in the first mode.

In some embodiments, the storage device further comprises a plurality of controllers.

In some embodiments, the storage device is configured to operate in accordance with any of the methods described above.

In yet another aspect, any of the methods described above are performed by a storage device including: (1) memory, (2) one or more processors coupled to the memory, and (3) one or more programs, stored in the memory and executed by the one or more processors, the one or more programs including instructions for performing any of the methods described above.

In yet another aspect, any of the methods described above are performed by a storage device operable to manage power inrush and startup performance. In some embodiments, the device includes: (1) an interface for coupling the storage device to a host system; (2) a power control processor (PCP); (3) means for powering PCP using a first input voltage; (4) means for operating the PCP in a first mode, while the PCP is powered using the first input voltage, where operating the PCP in the first mode includes charging an energy storage device; (5) means for powering the PCP, after achieving a predefined internal state, which includes the energy storage device charged to a predefined level, using a power supply voltage distinct from the first input voltage; and (6) means for operating the PCP in a second mode, while the PCP is powered using the power supply voltage, where the PCP operates at a higher performance level in the second mode than in the first mode.

In yet another aspect, any of the methods described above are performed by a storage device including an interface for operatively coupling the storage device with a host system and means for performing any of the methods described herein.

In yet another aspect, some embodiments include a non-transitory computer readable storage medium, storing one or more programs for execution by one or more processors of a storage device, the one or more programs including instructions for performing any of the methods described herein.

Numerous details are described herein in order to provide a thorough understanding of the example implementations illustrated in the accompanying drawings. However, some embodiments may be practiced without many of the specific details, and the scope of the claims is only limited by those features and aspects specifically recited in the claims. Furthermore, well-known methods, components, and circuits have not been described in exhaustive detail so as not to unnecessarily obscure more pertinent aspects of the implementations described herein.

FIG. 1 is a block diagram illustrating an implementation of a data storage system 100, in accordance with some embodiments. While some example features are illustrated, various other features have not been illustrated for the sake of brevity and so as not to obscure more pertinent aspects of the example implementations disclosed herein. To that end, as a non-limiting example, data storage system 100 includes storage device 120 (also sometimes called a data storage device, or information storage device, or a memory device), which includes host interface 122, supervisory module 126, storage controller 128 (also sometimes called a memory controller), one or more non-volatile memory (NVM) controllers 130 such as flash controllers, and non-volatile memory (e.g., one or more NVM device(s) 140, 142 such as one or more flash memory devices), and is used in conjunction with computer system 110. In some implementations, storage device 120 includes a single NVM device while in other implementations storage device 120 includes a plurality of NVM devices. In some implementations, NVM devices 140, 142 include NAND-type flash memory or NOR-type flash memory. Further, in some implementations, NVM controller 130 is a solid-state drive (SSD) controller. However, one or more other types of storage media may be included in accordance with aspects of a wide variety of implementations.

Computer system 110 is coupled to storage device 120 through data connections 101. However, in some implementations computer system 110 includes storage device 120 as a component and/or sub-system. Computer system 110 may be any suitable computer device, such as a personal computer, a workstation, a computer server, or any other computing device. Computer system 110 is sometimes called a host or host system. In some implementations, computer system 110 includes one or more processors, one or more types of memory, optionally includes a display and/or other user interface components such as a keyboard, a touch screen display, a mouse, a track-pad, a digital camera and/or any number of supplemental devices to add functionality. Further, in some implementations, computer system 110 sends one or more host commands (e.g., read commands and/or write commands) on control line 111 to storage device 120. In some implementations, computer system 110 is a server system, such as a server system in a data center, and does not have a display and other user interface components.

In some implementations, storage device 120 includes NVM devices 140, 142 such as flash memory devices (e.g., NVM devices 140-1 through 140-$n$ and NVM devices 142-1 through 142-$k$) and NVM controllers 130 (e.g., NVM controllers 130-1 through 130-$m$). In some implementations, each NVM controller of NVM controllers 130 include one or more processing units (also sometimes called CPUs or processors or microprocessors or microcontrollers) configured to execute instructions in one or more programs (e.g., in NVM controllers 130). In some implementations, the one or more processors are shared by one or more components within, and in some cases, beyond the function of NVM controllers 130. In some implementations, NVM controllers 130 are configured to receive (e.g., via reset module 612, FIG. 6) reset 144 from various components of storage device 120 (e.g., from supervisory module 126 and/or from storage controller 128). In some implementations, reset 144-1 and reset 144-$m$ are the same signal.

NVM devices 140, 142 are coupled to NVM controllers 130 through connections that typically convey commands in addition to data, and optionally convey metadata, error correction information and/or other information in addition to data values to be stored in NVM devices 140, 142 and data values read from NVM devices 140, 142. For example, NVM devices 140, 142 can be configured for enterprise storage suitable for applications such as cloud computing, or for caching data stored (or to be stored) in secondary storage, such as hard disk drives. Additionally and/or alternatively, flash memory (e.g., NVM devices 140, 142) can also be configured for relatively smaller-scale applications such as personal flash drives or hard-disk replacements for personal, laptop and tablet computers. Although flash memory devices and flash controllers are used as an example here, in some embodiments storage device 120 includes other non-volatile memory device(s) and corresponding non-volatile memory controller(s).

In some implementations, storage device 120 also includes host interface 122, supervisory module 126, and storage controller 128. Storage device 120 may include various additional features that have not been illustrated for the sake of brevity and so as not to obscure more pertinent features of the example implementations disclosed herein, and a different arrangement of features may be possible. Host interface 122 provides an interface to computer system 110 through data connections 101.

In some implementations, supervisory module 126 (also sometimes called a data hardening module) includes one or more processing units (also sometimes called CPUs or processors or microprocessors or microcontrollers) configured to execute instructions in one or more programs (e.g., in supervisory module 126). In some implementations, the one or more processors are shared by one or more components within, and in some cases, beyond the function of supervisory module 126. Supervisory module 126 is coupled to host interface 122, storage controller 128, and NVM controllers 130 in order to coordinate the operation of these components, including supervising and controlling functions such as power up, power down, data hardening, charging energy storage device(s), data logging, and other aspects of managing functions on storage device 120.

Storage controller 128 is coupled to host interface 122, supervisory module 126, and NVM controllers 130. In some implementations, during a write operation, storage controller 128 receives data from computer system 110 through host interface 122 and during a read operation, storage controller 128 sends data to computer system 110 through host interface 122. Further, host interface 122 provides additional data, signals, voltages, and/or other information needed for communication between storage controller 128 and computer system 110. In some embodiments, storage controller 128 and host interface 122 use a defined interface standard for communication, such as double data rate type three synchronous dynamic random access memory (DDR3). In some embodiments, storage controller 128 and NVM controllers 130 use a defined interface standard for communication, such as serial advance technology attachment (SATA). In some other implementations, the device interface used by storage controller 128 to communicate with NVM controllers 130 is SAS (serial attached SCSI), or other storage interface. In some implementations, storage controller 128 is configured to receive (e.g., via reset module 512, FIG. 5) reset 143 from various components of storage device 120 (e.g., from supervisory module 126 and/or from host interface 122). In some implementations, reset 143, reset 144-1, and reset 144-$m$ are the same signal. In some implementations, reset 143, reset 144-1, and reset 144-$m$ are independent signals. In some implementations, reset 143, reset 144-1, and reset 144-$m$ are transmitted via the same communication bus. In some implementations, reset 143, reset 144-1, and reset 144-$m$ are controlled separately. In some implementations, storage controller 128 includes one or more processing units (also sometimes called CPUs or processors or microprocessors or microcontrollers) configured to execute instructions in one or more programs (e.g., in storage controller 128). In some implementations, the one or more processors are shared by one or more components within, and in some cases, beyond the function of storage controller 128.

Figure 2:
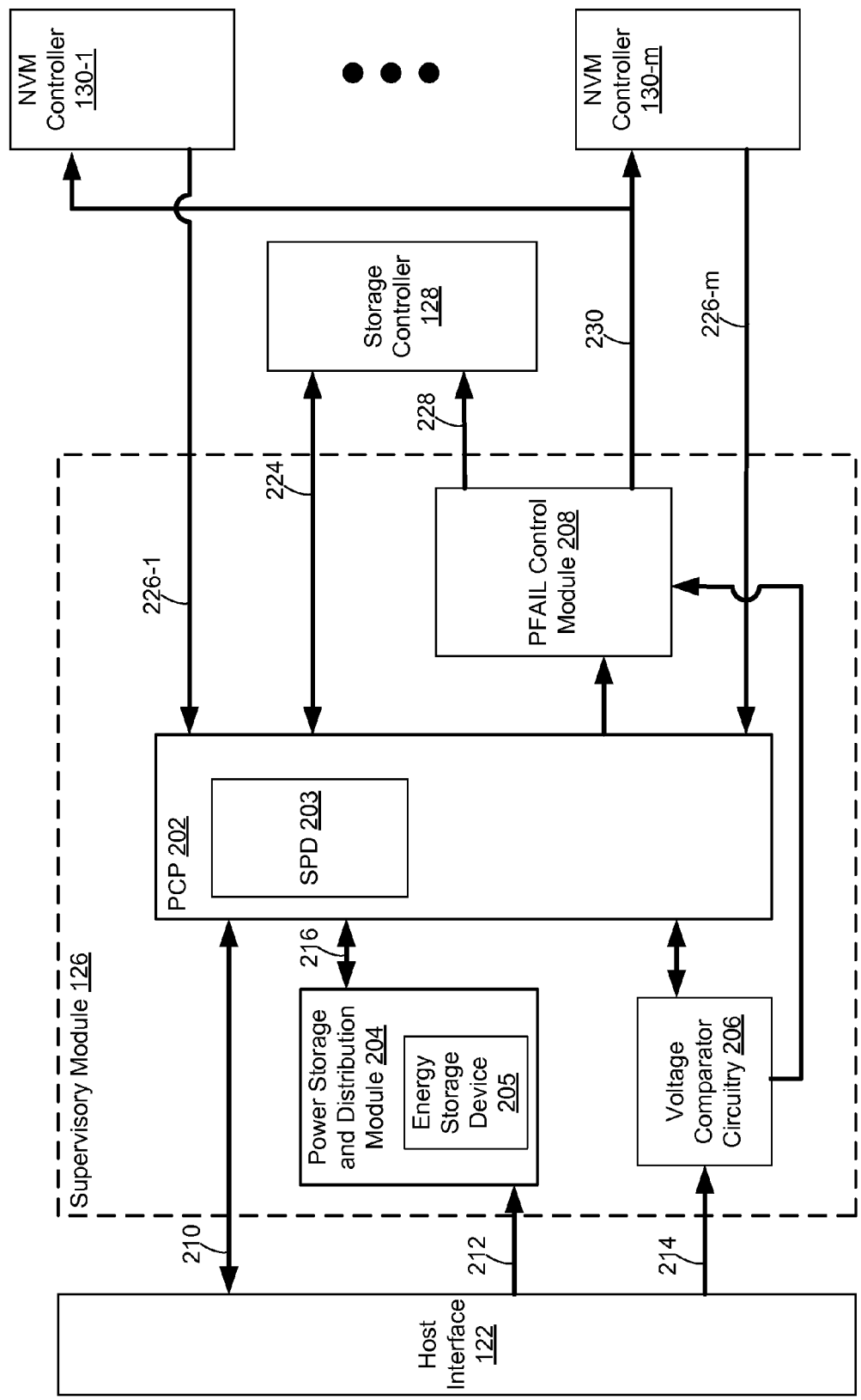
FIG. 2 is a block diagram illustrating an implementation of supervisory module, in accordance with some embodiments.

FIG. 2 is a block diagram illustrating an implementation of supervisory module 126, in accordance with some embodiments. Supervisory module 126 is coupled to host interface 122 via communication bus 210, voltage input 212 (e.g., Vdd 402, FIG. 4) and voltage input 214. In some implementations, voltage input 212 is a part of a communication bus. In some implementations, voltage input 212 is the same as voltage input 214, while in other implementations voltage input 212 is different from voltage input 214. In some implementations, communication bus 210 includes a voltage source (e.g., $V_{SPD}$ 404, FIG. 4) supplied through host interface 122.

Communication buses (e.g., communication bus 210, FIG. 2) optionally include circuitry (sometimes called a chipset) that interconnects and controls communications between system components. Supervisory module 126 is coupled to host interface 122, storage controller 128, and NVM controllers 130 (e.g., NVM controllers 130-1 through 130$m$) via communication buses (e.g., communication bus 148, FIG. 1).

Supervisory module 126 includes power control processor (PCP) 202 (including SPD 203) for executing modules, programs and/or instructions stored therein. In some implementations, PCP 202 is coupled to NVM controllers 130 (e.g., NVM controllers 130-1 through 130-m) via PFAIL lines 226. In some implementations, PFAIL lines 226 are part of a communication bus. In some implementations, PFAIL lines 226 are tri-state lines that are driven by PCP 202, NVM controllers 130, or neither, depending on the operations of supervisory module 126. PCP 202 is coupled to storage controller 128 via communication bus 224. In some implementations, communication bus 224 includes a power test command and/or signal to notify storage controller 128 of pending power fail operations affecting one or more NVM controllers 130.

Supervisory module 126 also includes power storage and distribution module 204 (including energy storage device 205), power failure (PFAIL) control module 208, voltage comparator circuitry 206, and a plurality of communication buses (e.g., communication buses 210, 216, 222, and 224). In some implementations, power storage and distribution module 204 includes circuitry for monitoring, storing, and distributing power for a storage device (e.g., storage device 120, FIG. 1), including monitoring, controlling, charging, and/or testing energy storage device 205. In some embodiments, energy storage device 205 includes one or more capacitors. In other embodiments, energy storage device 205 includes one or more inductors or any other passive elements that store energy. In some implementations, energy storage device 205 is charged by boosting voltage input 212.

Voltage comparator circuitry 206 is coupled to PCP 202 and PFAIL control module 208. In some implementations, voltage comparator circuitry 206 includes circuitry for monitoring voltage input 214, detecting undervoltage and overvoltage conditions, and signaling power failure conditions to various components (e.g., PFAIL control module 208) of supervisory module 126. While voltage comparator circuitry 206 is shown in FIG. 2 as being external to PCP 202, in some implementations voltage comparator circuitry 206, or portions of voltage comparator circuitry 206, are embedded in PCP 202. Alternatively, in some implementations, PCP 202 includes analog to digital conversion (ADC) circuitry, for converting voltage input 214 to a digital value, and comparison circuitry or software for detecting undervoltage and overvoltage conditions.

PFAIL control module 208 is coupled to PCP 202, voltage comparator circuitry 206, storage controller 128, and NVM controllers 130 (e.g., NVM controllers 130-1 through 130-m). In some implementations, PFAIL control module 208 includes circuitry to detect power fail conditions, signal power failures to storage controller 128 via PFAIL line 228, and signal power failures to NVM controllers (e.g., NVM controllers 130-1 through 130-m) via PFAIL lines 230. In some implementations, PFAIL lines 230 are part of a communication bus between PFAIL control module 208 and NVM controllers 130.

SPD device 203 is coupled to host interface 122. In some embodiments, SPD 203 is a part of (e.g., integrated into) PCP 202, while in some other embodiments, SPD 203 is separate and distinct from PCP 202. Serial presence detect (SPD) refers to a standardized way to automatically access information about a computer memory module (e.g., storage device 120). For example, information about the type of the device (e.g., where the device type is one of a predefined set of device types), and the storage capacity of the device can be communicated with a host system (e.g., computer system 110) through SPD device 203. In another example, if the memory module has a failure, the failure can be communicated with a host system (e.g., computer system 110) through SPD device 203.

Figure 3:
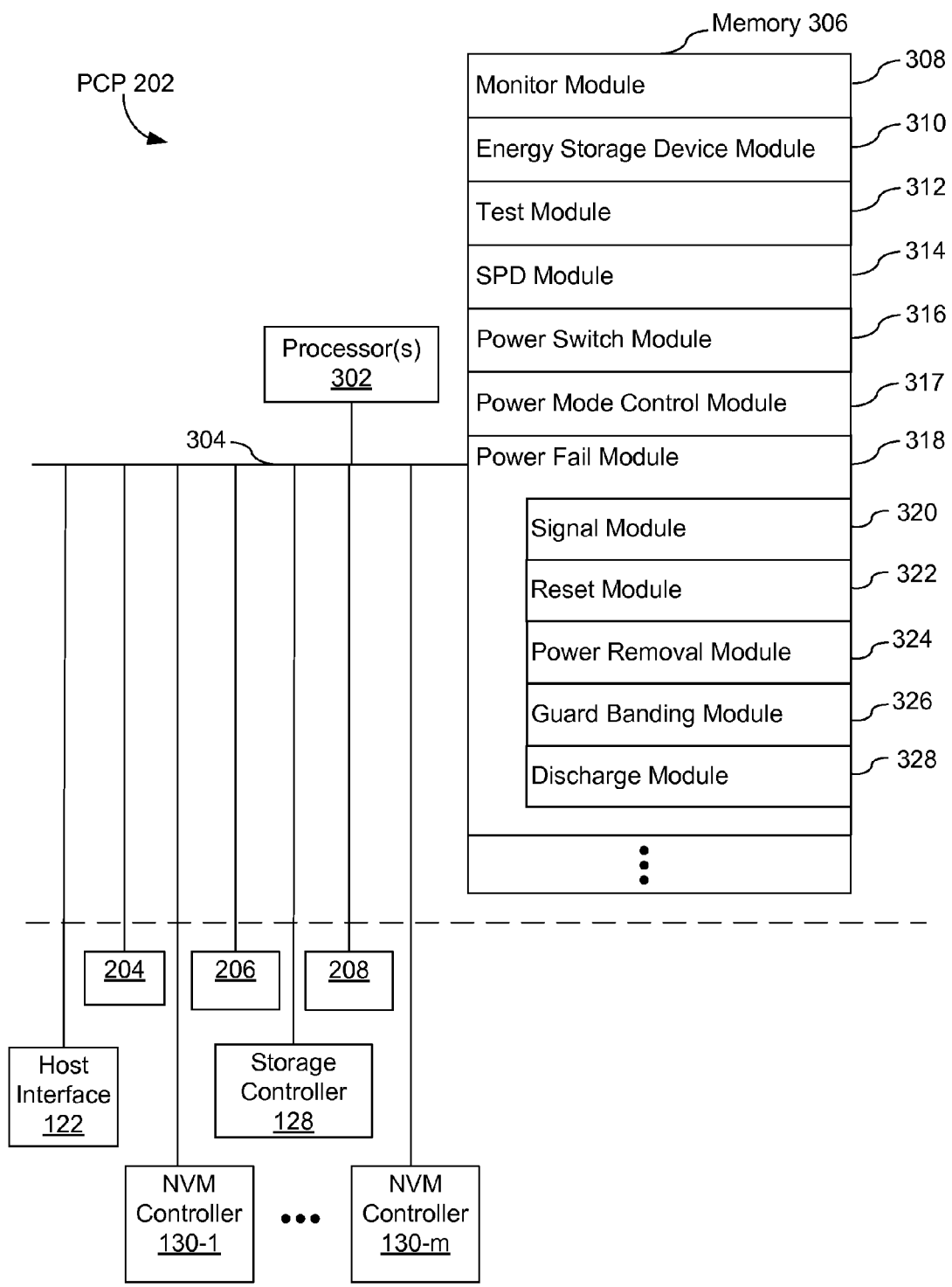
FIG. 3 is a block diagram illustrating an implementation of a power control processor, in accordance with some embodiments.

FIG. 3 is a block diagram illustrating an implementation of PCP 202, in accordance with some embodiments. PCP 202 includes one or more processors (also sometimes called CPUs or processing units or microprocessors or microcontrollers) 302 for executing modules, programs and/or instructions stored in memory 306 and thereby performing processing operations, memory 306, and one or more communication buses 304 for interconnecting these components. Communication buses 304 optionally include circuitry (sometimes called a chipset) that interconnects and controls communications between system components. PCP 202 is coupled to host interface 122, storage controller 128, NVM controllers 130 (e.g., NVM controllers 130-1 through 130-m), power storage and distribution module 204, voltage comparator circuitry 206, and PFAIL control module 208 by communication buses 308. Memory 306 includes high-speed random access memory, such as DRAM, SRAM, DDR RAM or other random access solid state memory devices, and may include non-volatile memory, such as one or more magnetic disk storage devices, optical disk storage devices, flash memory devices, or other non-volatile solid state storage devices. Memory 306 optionally includes one or more storage devices remotely located from processor(s) 302. Memory 306, or alternately the non-volatile memory device(s) within memory 306, comprises a non-transitory computer readable storage medium. In some embodiments, memory 306, or the computer readable storage medium of memory 306 stores the following programs, modules, and data structures, or a subset thereof:

- a monitor module 308 that is used for monitoring signals provided to a storage device (e.g., storage device 120, FIG. 1), for example to monitor and determine whether a power supply voltage provided to the storage device is lower than an under-voltage threshold;
- an energy storage device module 310 that is used for monitoring, controlling, charging, and/or testing an energy storage device (e.g., energy storage device 205) on the storage device;
- a test module 312 that is used for testing one or more functions of the storage device;
- an SPD module 314 for accessing information about a computer memory module and/or communicating with a host system;
- a power switch module 316 that is used for determining and controlling the voltage that is used to supply power to the storage device; and
- a power fail module 318 that is used for performing a power fail operation or a soft power fail operation in response to certain criterion or signals.

In some embodiments, memory 306, or the computer readable storage medium of memory 306 further stores a configuration module for configuring storage device 120 and supervisory module 126, and/or configuration values (such as one or more under-voltage threshold values) for configuring supervisory module 126, neither of which is explicitly shown in FIG. 3. In some implementations, upon power up and upon reset, the configuration module automatically sets the values of one or more configuration parameters of storage device 120 (and, optionally, determines which of two or more power fail modules, test modules, etc. to use) in accordance with the components of storage device 120 (e.g., the type of non-volatile memory components in storage device 120) and/or characteristics of the data storage system 100 that includes storage device 120.

In some embodiments, the power fail module 318 optionally includes the following modules or sub-modules, or a subset thereof:

- a signal module 320 that is used for signaling a power fail condition to a plurality of controllers on the storage device (e.g., storage controller 128 and NVM controllers 130, FIG. 1);
- a reset module 322 that is used for resetting the plurality of controllers on the storage device;
- a power removal module 324 that is used for removing power from the plurality of controllers on the storage device;
- a guard banding module 326 that is used for tolerating power fluctuations in a power supply voltage provided to the storage device; and
- a discharge module 328 that is used for discharging an energy storage device (e.g., energy storage device 205, FIG. 2) on the storage device.

Each of the above identified elements may be stored in one or more of the previously mentioned memory devices, and corresponds to a set of instructions for performing a function described above. The above identified modules or programs (i.e., sets of instructions) need not be implemented as separate software programs, procedures or modules, and thus various subsets of these modules may be combined or otherwise re-arranged in various embodiments. In some embodiments, memory 306 may store a subset of the modules and data structures identified above. Furthermore, memory 306 may store additional modules and data structures not described above. In some embodiments, the programs, modules, and data structures stored in memory 306, or the computer readable storage medium of memory 306, provide instructions for implementing respective operations in the methods described below with reference to FIGS. 8A-8C.

Although FIG. 3 shows PCP 202, FIG. 3 is intended more as a functional description of the various features which may be present in a PCP than as a structural schematic of the embodiments described herein. In practice, and as recognized by those of ordinary skill in the art, items shown separately could be combined and some items could be separated.

Figure 4:
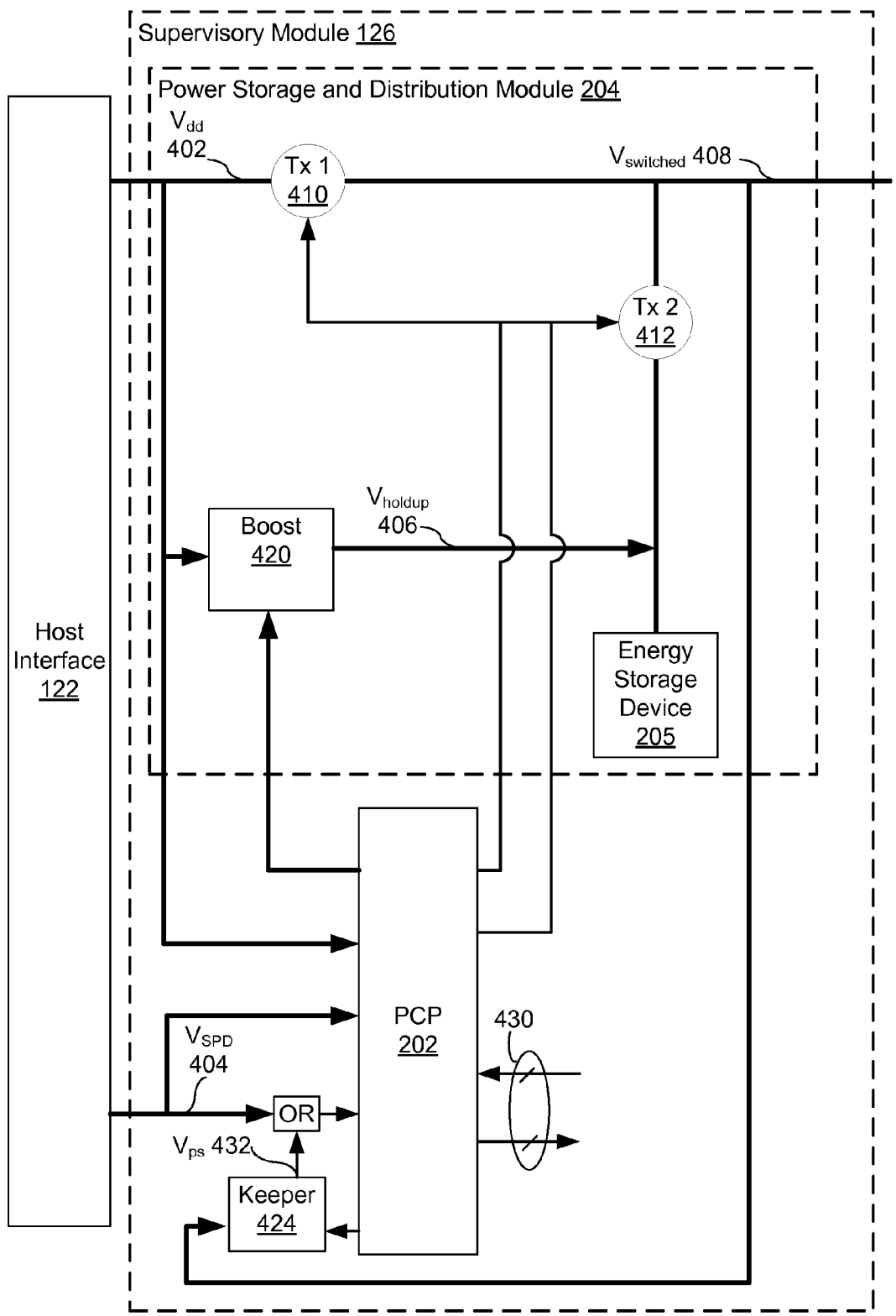
FIG. 4 is a block diagram illustrating an implementation of power storage and distribution circuitry, in accordance with some embodiments.

FIG. 4 is a block diagram illustrating an implementation of power storage and distribution module 204 and supervisory module 126, in accordance with some embodiments. While some example features are illustrated, various other features have not been illustrated for the sake of brevity and so as not to obscure more pertinent aspects of the example implementations disclosed herein. To that end, as a non-limiting example, power storage and distribution module 204 includes boost circuitry 420, energy storage device 205, transistors 410 and 412, and voltages $V_{dd}$ 402, $V_{holdup}$ 406, and $V_{switched}$ 408. In some implementations, $V_{dd}$ 402 is a voltage supplied by a host system (e.g., computer system 110, FIG. 1) and has a target value of 1.5 volts or less. In some implementations, $V_{holdup}$ 406 is a boosted up voltage from $V_{dd}$ 402 and has a target value of 5.7 volts. In some embodiments, $V_{holdup}$ 406 is used to charge energy storage device 205. In some implementations, $V_{SPD}$ 404 is a voltage supplied for serial presence detect (SPD) functionality and has a target value of 3.3 volts. Further, in some implementations, only one of transistors 410 and 412 is enabled at any one time. For example, whenever transistor 412 is enabled, transistor 410 is disabled (open state), so as to ensure that power from energy storage device 205 is not drained to the host system. Furthermore, whenever transistor 410 is enabled, providing power to components of storage device 120 from the host system, transistor 412 is disabled. In some implementations, both transistor 410 and transistor 412 can be disabled at the same time. For example, in some embodiments, removing power from a component of storage device 120 (e.g., storage controller 128 and/or NVM controllers 130) includes disabling both transistor 410 and transistor 412 at the same time. In some implementations, energy storage device 205 comprises a power holdup circuit, implemented using one or more capacitors. In some implementations, energy storage device 205 stores, immediately prior to a power fail condition being detected, at least approximately 30 to 70 millijoules of energy per NVM controller 130 in storage device 120.

In some implementations, PCP 202 monitors and manages the functionality in power storage and distribution module 204. For example, PCP 202 monitors voltages $V_{dd}$ 402 and $V_{SPD}$ 404. In some implementations, if either $V_{dd}$ 402 or $V_{SPD}$ 404 fall below corresponding under-voltage thresholds, PCP 202 signals a power fail condition to PFAIL control circuitry (e.g., PFAIL control module 208, FIG. 2). In some implementations, PCP 202 signals the power fail condition to a plurality of controllers on storage device 120 (e.g., storage controller 128 and NVM controllers 130, FIG. 1). In some embodiments, the under-voltage threshold varies depending on the target value of the voltage. For example, if the target voltage for $V_{dd}$ 402 is 1.5 volts, the under-voltage threshold may be 1.5 volts minus 5% (i.e., 1.425 volts), so PCP 202 would signal a power fail condition if $V_{dd}$ 402 is lower than 1.425 volts. In some implementations, the under-voltage threshold for $V_{dd}$ 402 is different than the under-voltage threshold for $V_{SPD}$ 404.

In some embodiments, during regular operation of storage device 120, $V_{dd}$ 402 is used to supply power to storage device 120. However, during a power fail operation or a soft power fail operation, energy storage device 205 is used to provide power to storage device 120. In some implementations, PCP 202 controls transistors 410 and 412 to control $V_{switched}$ 408 to be voltage from $V_{dd}$ 402 (e.g., during regular operation) or voltage from energy storage device 205 (e.g., during a power fail operation or a soft power fail operation). For example, during regular operation of storage device 120, $V_{dd}$ 402 is used to supply power to storage device 120, so transistor 410 is turned on (e.g., to complete the connection between $V_{dd}$ 402 and $V_{switched}$ 408) and transistor 412 is turned off (e.g., to disable the connection between energy storage device 205 and $V_{switched}$ 408). However, during a power fail operation or a soft power fail operation, energy storage device 205 is used to provide power to storage device 120, so transistor 410 is turned off (e.g., to disable the connection between $V_{dd}$ 402 and $V_{switched}$ 408) and transistor 412 is turned on (e.g., to enable the connection between energy storage device 205 and $V_{switched}$ 408). In some embodiments, during a power fail operation or a soft power fail operation, $V_{switched}$ 408 is provided to power control systems (also sometimes called power regulators), which convert $V_{switched}$ 408 to the voltages required by various components of storage device 120 (e.g., 0.9 volts, 1.35 volts, 1.5 volts, 1.8 volts, and/or 2.5 volts) and provide those voltages to the appropriate components. Any energy storage device, including one or more capacitors, one or more inductors, or one or more other passive elements that store energy, may be used to store energy to be used during a power fail operation or a soft power fail operation.

In some implementations, energy storage device 205 is charged using $V_{holdup}$ 406, a voltage higher than $V_{dd}$ 402. In some implementations, $V_{dd}$ 402 is boosted up to $V_{holdup}$ 406 using boost circuitry 420 (e.g., 1.35 volts or 1.5 volts is boosted up to 5.7 volts). In some implementations, boost circuitry 420 is controlled and enabled by PCP 202. Further, in some embodiments, $V_{switched}$ 408 is used as an input to keeper circuitry 424, which along with $V_{SPD}$ 404 provides power to PCP 202. During a power fail operation or a soft power fail operation, $V_{switched}$ 408 is provided via keeper circuitry 424 to PCP 202 so as to provide power to PCP 202. In some implementations, PCP 202 has one or more connections 430 used to monitor and control other functions within storage device 120. In some implementations, $V_{SPD}$ 404 provides power to keeper circuitry 424. Furthermore, in some implementations, $V_{SPD}$ 404 is provided to storage device 120 before $V_{dd}$ 402 is provided to storage device 120, allowing devices in storage device 120 to operate before main power $V_{dd}$ 402 is provided to storage device 120. In some implementation, keeper circuitry 424 provides $V_{ps}$ 432 to PCP 202.

In some implementations, supervisory module 126 (e.g., PCP 202) uses an algorithm to selectively test one or more capacitors from energy storage device 205 during operation of the storage device. In some implementations, one or more capacitors from energy storage device 205 are tested during regular operation of the storage device (as opposed to during a power fail operation). Since testing the capacitor(s) will discharge the capacitor(s), supervisory module 126 manages the coordination of testing the capacitor(s) to ensure that testing of the capacitor(s) from energy storage device 205 does not interfere with other operations. In some implementations, an energy storage device module (e.g., energy storage device module 310, FIG. 3) is used to selectively test one or more capacitors from the energy storage device during operation of the storage device, as described above with respect to FIG. 3.

In some embodiments, testing energy storage device 205 includes charging the energy storage device using a higher voltage than the power supply voltage provided to the storage device and determining whether energy storage device 205 meets a predefined minimum charge level threshold (sometimes called the minimum charge level threshold) within a predefined charge time. For example, if the predefined minimum charge level threshold is 95% charge capacity and the predefined charge time is 25 ms, the storage device determines whether the energy storage device is charged to at least 95% charge capacity within 25 ms. In some implementations, an energy storage device module (e.g., energy storage device module 310, FIG. 3) is used to determine whether energy storage device 205 meets a predefined minimum charge level threshold within a predefined charge time, as described above with respect to FIG. 3. Further, in accordance with a determination that energy storage device 205 does not meet the predefined minimum charge level threshold in the predefined charge time, the storage device prevents operation of the storage device. In some implementations, a determination that energy storage device 205 does not meet the predefined minimum charge level threshold in the predefined charge time indicates that there will be a data hardening failure when a power fail operation is performed in the future (e.g., a predictive failure detection). As a result, operation of the storage device is prevented to avoid a future data hardening failure. In some implementations, preventing operation of the storage device includes communicating a failure message to a host system (e.g., computer system 110, FIG. 1). In some implementations, the failure message is communicated with the host system through a SPD device (e.g., SPD device 203, FIG. 2) or a SPD bus controller.

Figure 5:
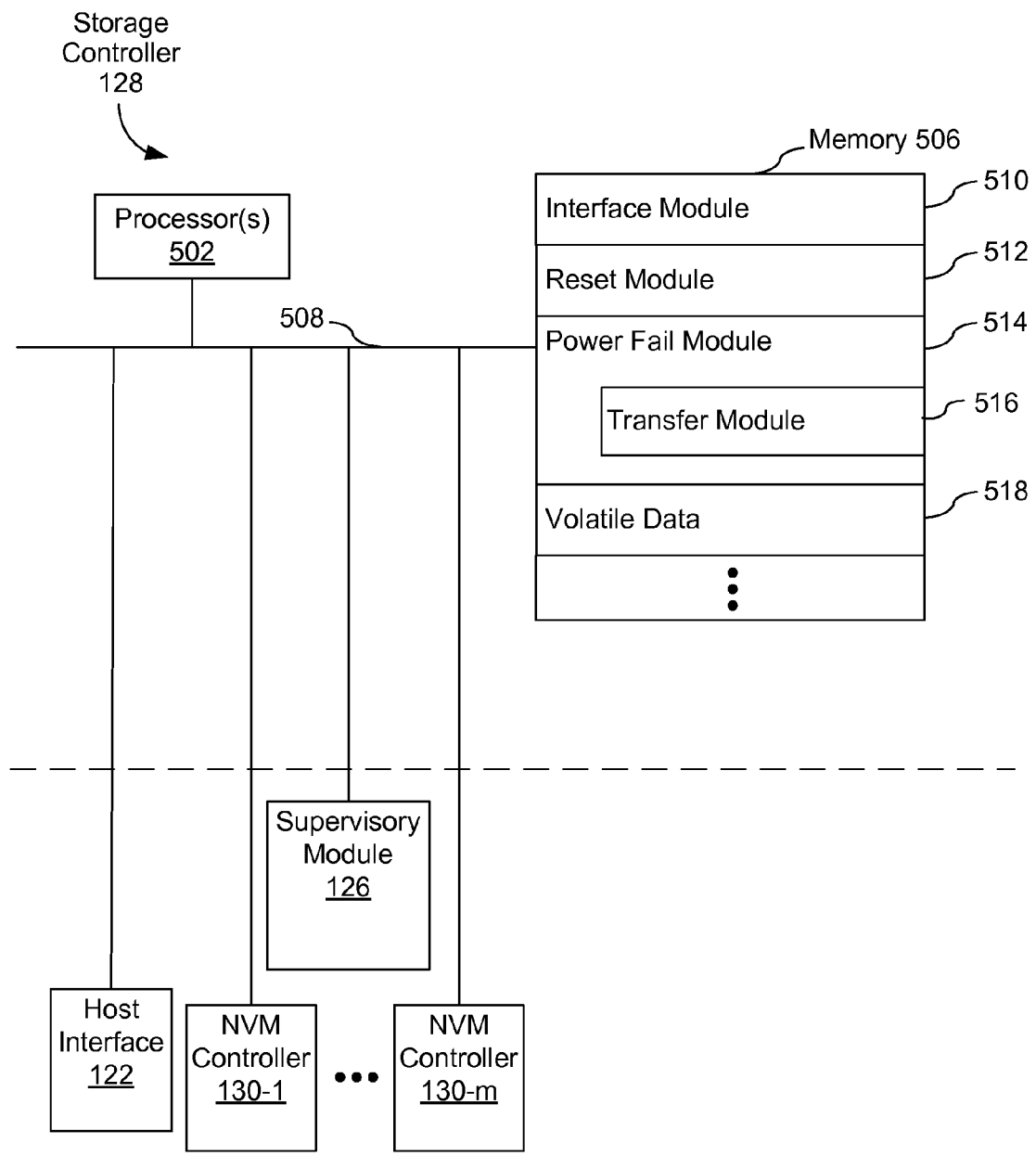
FIG. 5 is a block diagram illustrating an implementation of a memory controller, in accordance with some embodiments.

FIG. 5 is a block diagram illustrating an implementation of a storage controller 128, in accordance with some embodiments. Storage controller 128 typically includes one or more processors (also sometimes called CPUs or processing units or microprocessors or microcontrollers) 502 for executing modules, programs and/or instructions stored in memory 506 and thereby performing processing operations, memory 306, and one or more communication buses 508 for interconnecting these components. Communication buses 508 optionally include circuitry (sometimes called a chipset) that interconnects and controls communications between system components. Storage controller 128 is coupled to host interface 122, supervisory module 126, and NVM controllers 130 (e.g., NVM controllers 130-1 through 130-m) by communication buses 508. Memory 506 includes high-speed random access memory, such as DRAM, SRAM, DDR RAM or other random access solid state memory devices, and may include non-volatile memory, such as one or more magnetic disk storage devices, optical disk storage devices, flash memory devices, or other non-volatile solid state storage devices. Memory 506 optionally includes one or more storage devices remotely located from processor(s) 502. Memory 506, or alternately the non-volatile memory device(s) within memory 506, comprises a non-transitory computer readable storage medium. In some embodiments, memory 506, or the computer readable storage medium of memory 506 stores the following programs, modules, and data structures, or a subset thereof:

- an interface module 510 that is used for communicating with other components, such as host interface 122, supervisory module 126, and NVM controllers 130;
- a reset module 512 that is used for resetting storage controller 128; and
- a power fail module 514 that is used for performing a power fail operation or a soft power fail operation.

In some embodiments, the power fail module 514 optionally includes a transfer module 516 that is used for transferring data held in volatile memory to non-volatile memory.

Each of the above identified elements may be stored in one or more of the previously mentioned memory devices, and corresponds to a set of instructions for performing a function described above. The above identified modules or programs (i.e., sets of instructions) need not be implemented as separate software programs, procedures or modules, and thus various subsets of these modules may be combined or otherwise re-arranged in various embodiments. In some embodiments, memory 506 may store a subset of the modules and data structures identified above. Furthermore, memory 506 may store additional modules and data structures not described above. In some embodiments, the programs, modules, and data structures stored in memory 506, or the computer readable storage medium of memory 506, provide instructions for implementing respective operations in the methods described below with reference to FIGS. 8A-8C.

Although FIG. 5 shows a storage controller 128, FIG. 5 is intended more as a functional description of the various features which may be present in a memory controller than as a structural schematic of the embodiments described herein. In practice, and as recognized by those of ordinary skill in the art, items shown separately could be combined and some items could be separated.

Figure 6:
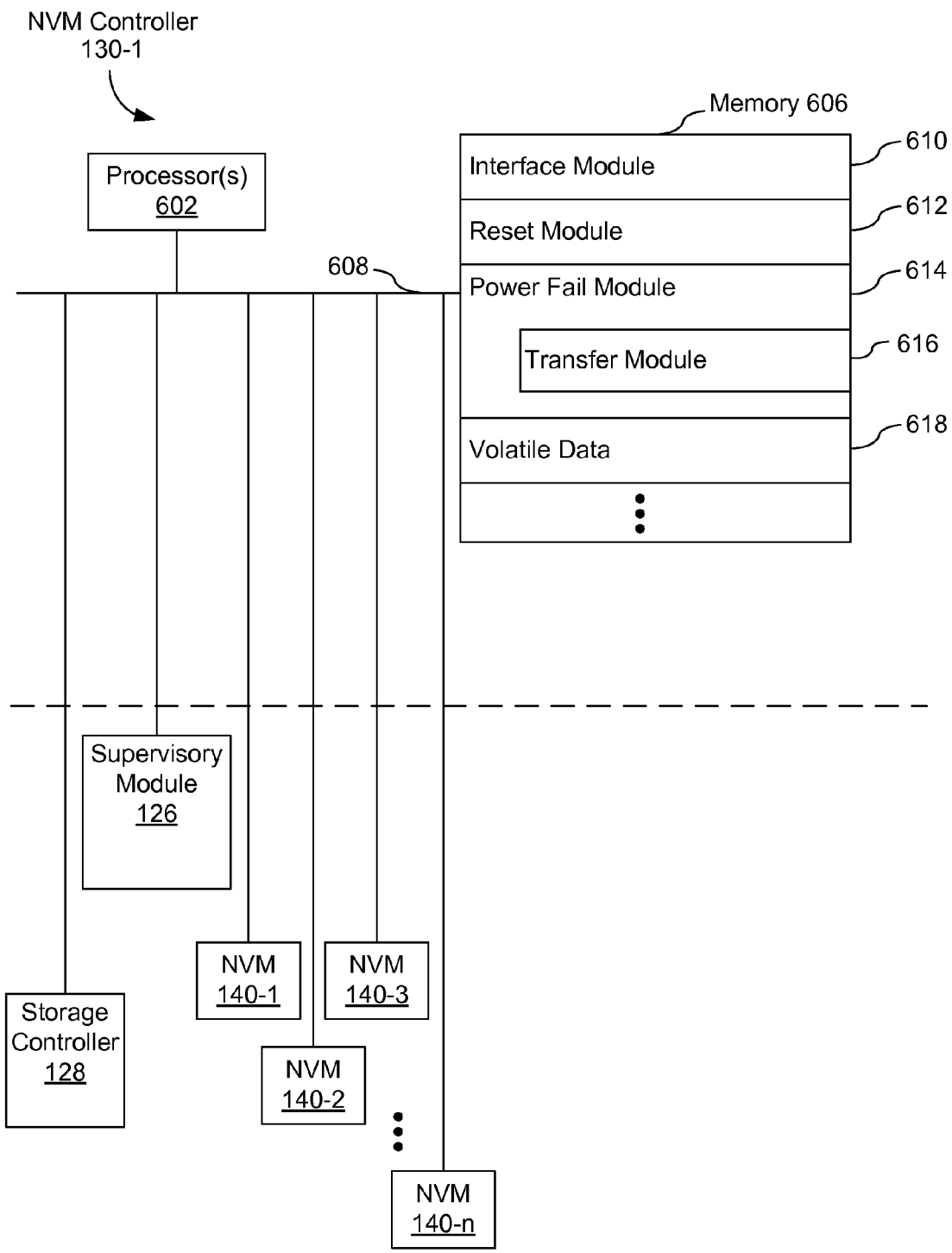
FIG. 6 is a block diagram illustrating an implementation of a NVM controller, in accordance with some embodiments.

FIG. 6 is a block diagram illustrating an implementation of a NVM controller 130-1, such as a flash controller, in accordance with some embodiments. NVM controller 130-1 typically includes one or more processors (also sometimes called CPUs or processing units or microprocessors or microcontrollers) 602 for executing modules, programs and/or instructions stored in memory 606 and thereby performing processing operations, memory 606, and one or more communication buses 608 for interconnecting these components. Communication buses 608 optionally include circuitry (sometimes called a chipset) that interconnects and controls communications between system components. NVM controller 130-1 is coupled to storage controller 128, supervisory module 126, and NVM devices 140 (e.g., NVM devices 140-1 through 140-n, such as flash memory devices) by communication buses 608. Memory 606 includes high-speed random access memory, such as DRAM, SRAM, DDR RAM or other random access solid state memory devices, and may include non-volatile memory, such as one or more magnetic disk storage devices, optical disk storage devices, flash memory devices, or other non-volatile solid state storage devices. Memory 606 optionally includes one or more storage devices remotely located from processor(s) 602. Memory 606, or alternately the non-volatile memory device(s) within memory 606, comprises a non-transitory computer readable storage medium. In some embodiments, memory 606, or the computer readable storage medium of memory 606 stores the following programs, modules, and data structures, or a subset thereof:

an interface module 610 that is used for communicating with other components, such as storage controller 128, supervisory module 126, and NVM devices 140;

a reset module 612 that is used for resetting NVM controller 130-1; and a power fail module 614 that is used for performing a power fail operation or a soft power fail operation.

In some embodiments, the power fail module 614 optionally includes a transfer module 616 that is used for transferring data held in volatile memory to non-volatile memory.

Each of the above identified elements may be stored in one or more of the previously mentioned memory devices, and corresponds to a set of instructions for performing a function described above. The above identified modules or programs (i.e., sets of instructions) need not be implemented as separate software programs, procedures or modules, and thus various subsets of these modules may be combined or otherwise re-arranged in various embodiments. In some embodiments, memory 606 may store a subset of the modules and data structures identified above. Furthermore, memory 606 may store additional modules and data structures not described above. In some embodiments, the programs, modules, and data structures stored in memory 606, or the computer readable storage medium of memory 606, provide instructions for implementing respective operations in the methods described below with reference to FIGS. 8A-8C.

Although FIG. 6 shows a NVM controller 130-1, FIG. 6 is intended more as a functional description of the various features which may be present in a NVM controller than as a structural schematic of the embodiments described herein. In practice, and as recognized by those of ordinary skill in the art, items shown separately could be combined and some items could be separated. Further, although FIG. 6 shows a NVM controller 130-1, the description of FIG. 6 similarly applies to other NVM controllers (e.g., NVM controllers 130-2 through 130-m) in storage device 120 (FIG. 1).

Figure 7:
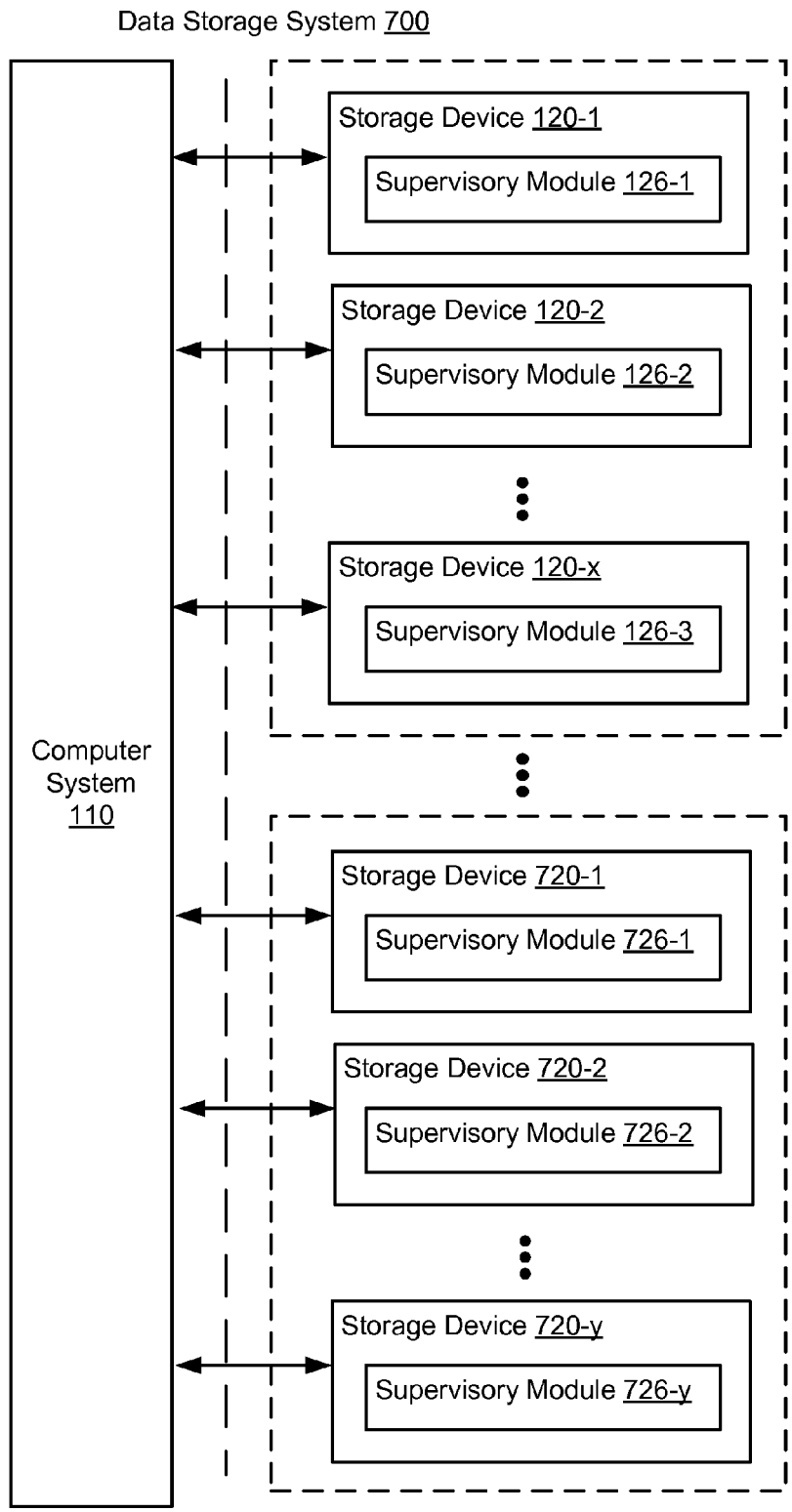
FIG. 7 is a block diagram illustrating an implementation of a data storage system, in accordance with some embodiments.

FIG. 7 is a block diagram illustrating an implementation of a data storage system 700, in accordance with some embodiments. While some example features are illustrated, various other features have not been illustrated for the sake of brevity and so as not to obscure more pertinent aspects of the example implementations disclosed herein. To that end, as a non-limiting example, data storage system 700 includes storage devices 120 (e.g., storage device 120-1 through storage device 120-x) and storage devices 720 (e.g., storage device 720-1 through storage device 720-y), and optionally additional groups of storage devices (not shown, all used in conjunction with computer system 110. In some embodiments, storage devices 120, 720 each include the features described above with respect to storage device 120 in FIG. 1. In some embodiments, storage devices 120 are in a first group and storage devices 720 are in a second group. For example, in some embodiments, a first group includes 8 storage devices (e.g., storage device 120-1 though storage device 120-8) and a second group includes 4 storage devices (e.g., storage device 720-1 through storage device 720-4). In some embodiments, for example, computer system 110 has 16 DIMM device slots, with 12 DIMM devices populated, 8 DIMM devices in a first group (e.g., storage device 120-1 though storage device 120-8) and 4 DIMM devices in a second group (e.g., storage device 720-1 through storage device 720-4). Although not explicitly shown, in some embodiments, data storage system 700 includes one or more additional storage devices grouped in one or more additional groups.

In some embodiments, storage devices 120 include supervisory module 126 (e.g., storage device 120-1 through storage device 120-x include supervisory module 126-1 through supervisory module 126-x, respectively) and storage devices 720 include supervisory module 726 (e.g., storage device 720-1 through storage device 720-y include supervisory module 726-1 through supervisory module 726-y, respectively). In some embodiments, each storage device (e.g., storage devices 120, 720) includes an energy storage device (not shown in FIG. 7, but see 205 in FIGS. 2 and 4).

Traditional DIMM devices generally do not consume significant power upon initial power up. Further, traditional DIMM devices generally power up at the same time when power is first applied (e.g., by computer system 110). Once all the DIMM devices are powered up, a host system (e.g., computer system 110) can use the DIMM devices and distribute input/output (I/O) operations (e.g., read commands and/or write commands) across the array of DIMM devices. However, storage devices with data hardening functionality (e.g., DIMM devices including non-volatile memory, such as flash memory) use energy storage devices (e.g., energy storage device 205, FIG. 2) to store energy for later use, if and when input power (e.g., $V_{dd}$ 402 and/or $V_{SPD}$ 404, FIG. 4) is lost. For a given storage device (e.g., storage device 120-1), the energy storage device (e.g., energy storage device 205, FIG. 2) is initially charged prior to the storage device becoming available to the host system (e.g., computer system 110), and this charging can result in high initial charge currents. In a host system (e.g., computer system 110) with multiple storage device slots (e.g., 16 DIMM device slots) populated by multiple storage devices (e.g., 12 DIMM devices populated), power management of the storage devices (e.g., storage devices 120, 720) is important to manage power demands on the host system during power-on (sometimes called power-up) conditions.

In some embodiments, data storage system 700 uses a staggered approach to power on storage devices 120, 720 to stagger the high initial charge currents associated with charging each of the energy storage devices. In some embodiments, charging of the energy storage device on each storage device is delayed by a time delay determined in accordance with a unique location associated with each storage device. For example, data storage system 700 can have eight storage devices populated in a first group (e.g., storage device 120-1 though storage device 120-8), with the storage devices located in slot 0 though slot 7, respectively (e.g., storage device 120-1 is located in slot 0, storage device 120-2 is located in slot 1, . . . , and storage device 120-8 is located in slot 7). In some embodiments, a general DIMM slot includes three input signals that are normally used for System Management Bus (SMBus) addressing and in some embodiments, each signal has a pull-up resistor on the motherboard of the host system (e.g., computer system 110). The host system sets the state of these three input signals for each slot such that each of the 8 slots (e.g., slot 0 through slot 7) has a unique address (sometimes called slot location). For example, in some embodiments, slot 0 has an address of 000 (in binary), slot 1 has an address of 001, slot 2 has an address of 010, and so on.

In some embodiments, the supervisory module associated with each storage device detects the unique address associated with the storage device (e.g., the slot location) and determines a time delay for the storage device based on the address. In some embodiments, determining the time delay for the storage device in accordance with the unique location associated with the storage device includes using a predefined time interval to determine the time delay. In some embodiments, determining the time delay for the storage device in accordance with the unique location associated with the storage device includes multiplying the unique address by a predefined time interval to determine the time delay. In some embodiments, utilizing a time delay for the storage device allows for power sequencing with multiple storage devices (e.g., multiple DIMM devices). Power sequencing limits the total system inrush current (e.g., the total inrush current at a system level). Stated another way, power sequencing (e.g., by determining the time delay for each storage device in accordance with the unique location associated with the storage device) limits the peak inrush current at a system level. In some implementations, limiting the total system inrush current, or peak system inrush current, prevents power failures and/or device failures.

For example, in some embodiments, using the example above where storage devices 120-1 through storage devices 120-8 are located in slot 0 through slot 7, respectively, and using a predefined time interval (sometimes called stagger time) of 50 milliseconds (ms) to determine the time delay, supervisory module 126-1 detects that storage device 120-1 is located in slot 0 with an address of 000 and determines a time delay for storage device 120-1 of 0 ms (i.e., 0*50 ms), accordingly. Similarly, supervisory module 126-2 detects that storage device 120-2 is located in slot 1 with an address of 001 and determines a time delay for storage device 120-2 of 50 ms (i.e., 1*50 ms), accordingly; supervisory module 126-3 detects that storage device 120-3 is located in slot 2 with an address of 010 and determines a time delay for storage device 120-3 of 100 ms (i.e., 2*50 ms), accordingly; and so on (e.g., time delay for storage device 120-4 in slot 3 is 150 ms, time delay for storage device 120-5 in slot 4 is 200 ms, time delay for storage device 120-6 in slot 5 is 250 ms, time delay for storage device 120-7 in slot 6 is 300 ms, and time delay for storage device 120-8 in slot 7 is 350 ms). Although 50 ms is used as the stagger time in this example, in other embodiments, a shorter or longer predefined time interval may be used. In some embodiments, the predefined time interval is less than a charge time to charge the energy storage device to a predefined level.

In some embodiments, the supervisory module associated with each storage device detects the address associated with the storage device (e.g., the slot location) and one or more additional signals (e.g., a group number) and determines a time delay for the storage device based on the unique location associated with the storage device (e.g., the address and group number of the storage device). For example, in some embodiments, data storage system 700 has twelve storage devices, with eight storage devices populated in a first group (e.g., storage device 120-1 though storage device 120-8) and 4 storage devices populated in a second group (e.g., storage device 720-1 through storage device 720-4). In some embodiments, determining the time delay for the storage device in accordance with the unique location associated with the storage device includes multiplying the address by a predefined time interval to determine the time delay and further adding a group time delay. For example, in some embodiments, if the predefined time interval is 50 ms, the group time delay for the first group is 0 ms, and the group time delay for the second group is 400 ms, the storage devices in the first group are staggered by 50 ms intervals, starting with 0 ms, and the storage devices in the second group are staggered by 50 ms intervals, starting with 400 ms (e.g., time delay for a storage device=(slot location*predefined time interval)+group time delay). In that example, storage device 120-1 (e.g., located in slot 0 of the first group) has a time delay of 0 ms (i.e., (0*50 ms)+0 ms), storage device 120-2 (e.g., located in slot 1 of the first group) has a time delay of 50 ms (i.e., (1*50 ms)+0 ms), storage device 120-3 (e.g., located in slot 2 of the first group) has a time delay of 100 ms (i.e., (2*50 ms)+0 ms), and so on. Using the same example, storage device 720-1 (e.g., located in slot 0 of the second group) has a time delay of 400 ms (i.e., (0*50 ms)+400 ms), storage device 720-2 (e.g., located in slot 1 of the second group) has a time delay of 450 ms (i.e., (1*50 ms)+400 ms), storage device 720-3 (e.g., located in slot 2 of the second group) has a time delay of 500 ms (i.e., (2*50 ms)+400 ms), and storage device 720-3 (e.g., located in slot 2 of the second group) has a time delay of 500 ms (i.e., (2*50 ms)+400 ms).

In some embodiments, the supervisory module associated with each storage device obtains a time delay for the storage device from non-volatile memory in the storage device (e.g. in a time delay table). For example, in some embodiments, a time delay table stores a plurality of predefined time delays (e.g., time delays associated with various unique locations), and the supervisory module associated with each storage device uses the time delay associated with the unique location for the storage device. As one example, using the example above, each supervisory module 726-i (for i=1 to 4) detects that the corresponding storage device 720-i is located in slot i-1 (e.g., slot 0, 1, 2 or 3) of the second group and obtains the corresponding time delay from non-volatile memory in storage device 720-i. In other embodiments, the supervisory module associated with each storage device obtains a time delay for the storage device from a host system (e.g., computer system 110).

Figure 8A:
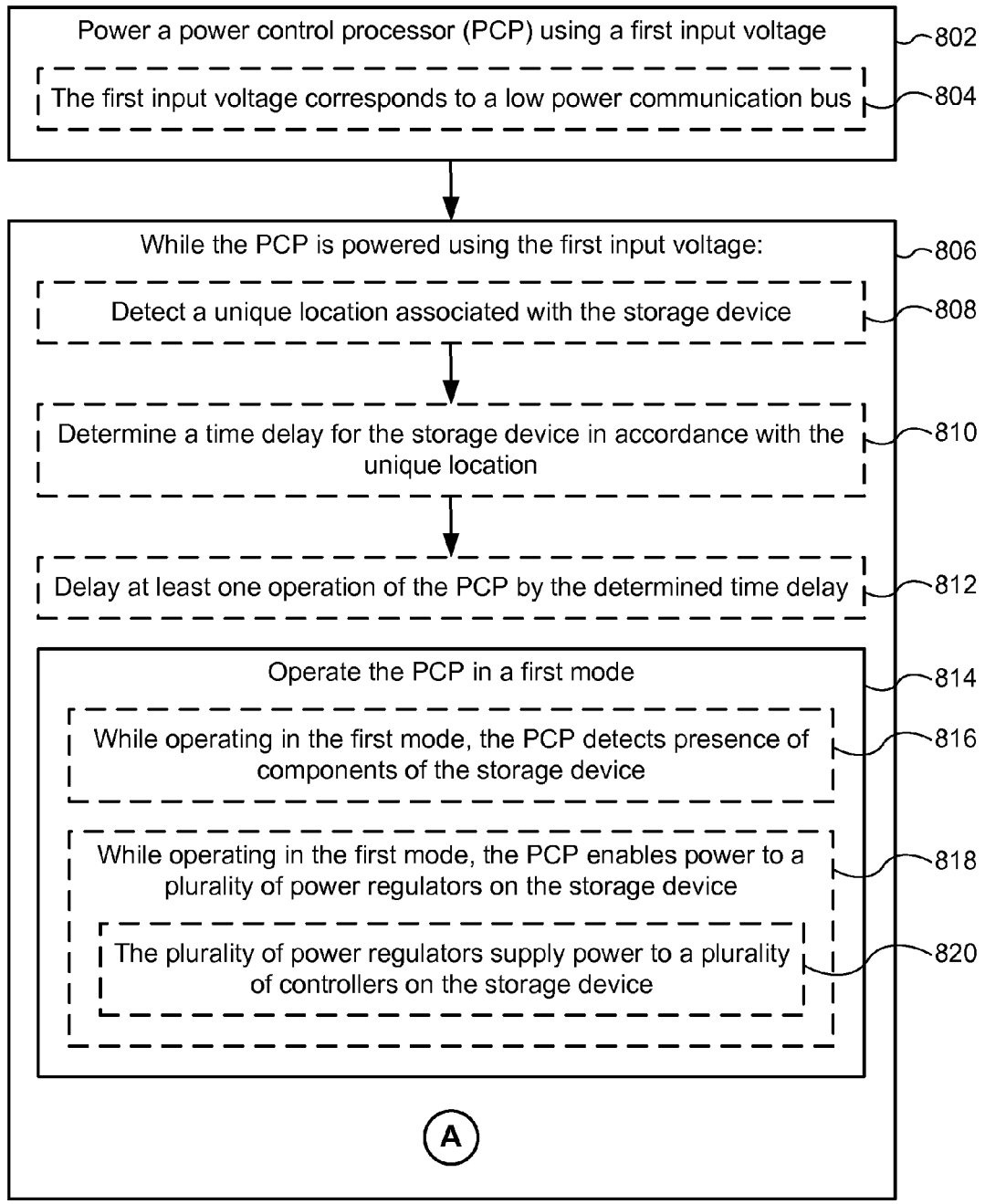
FIGS. 8A-8C illustrate a flowchart representation of a method of power management in a storage device, in accordance with some embodiments.
Figure 8B:
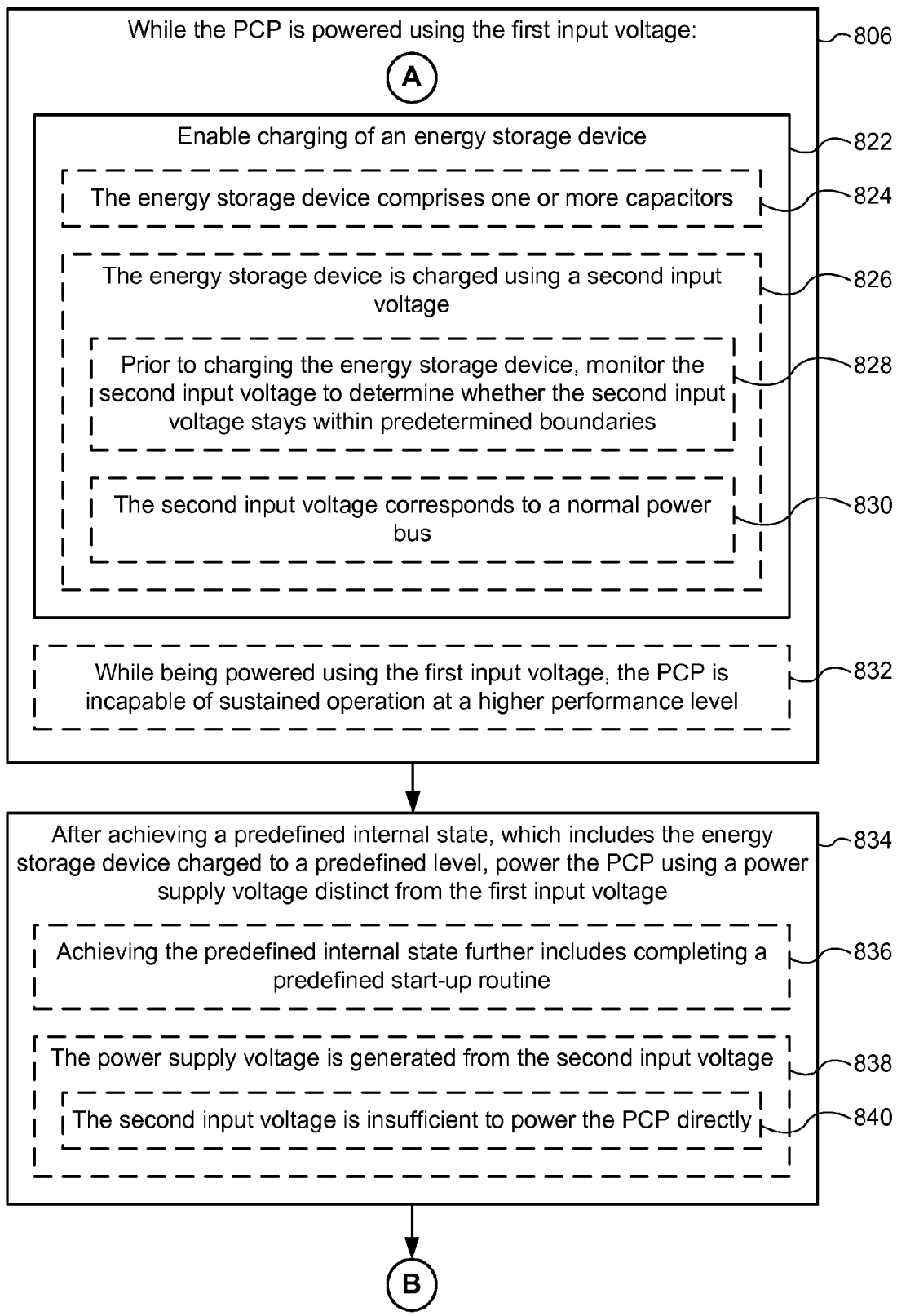
Figure 8C:
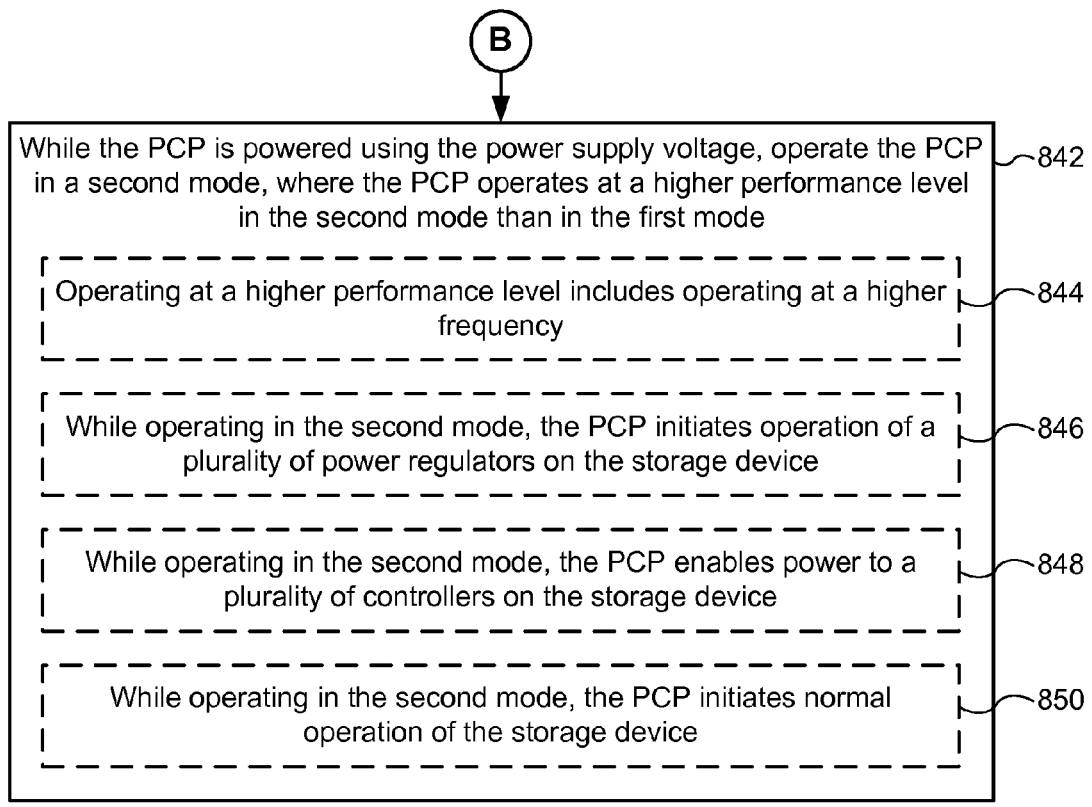

FIGS. 8A-8C illustrate a flowchart representation of a method 800 of power management in a storage device, in accordance with some embodiments. In some embodiments, the storage device comprises a dual in-line memory module (DIMM) device. In some implementations, the storage device is compatible with a DIMM memory slot. For example, in some implementations, the storage device is compatible with a 240-pin DIMM memory slot using a DDR3 interface specification. In some implementations, the storage device (e.g., storage device 120, FIG. 1) coordinates and manages multiple sub-system components to manage power and startup performance, which initiates performance of method 800. At least in some implementations, method 800 is performed by a storage device (e.g., storage device 120, FIG. 1) or one or more components of the storage device (e.g., supervisory module 126, storage controller 128, and/or NVM controllers 130, FIG. 1). In some embodiments, method 800 is governed by instructions that are stored in a non-transitory computer readable storage medium and that are executed by one or more processors of a device, such as the one or more processors 302 of PCP 202, the one or more processors 502 of storage controller 128, and/or the one or more processors 602 of NVM controllers 130, as shown in FIGS. 3, 5, and 6.

The storage device powers (802) a power control processor (PCP) using a first input voltage. In some embodiments, the first input voltage corresponds (804) to a low power communication bus. In some implementations, the first input voltage is a serial presence detect (SPD) power supply voltage. In some implementations, the first input voltage is 3.3 volts. For example, in accordance with some implementations, PCP 202 in FIG. 4 is powered by input voltage $V_{SPD}$ 404.

In some embodiments, while the PCP is powered using the first input voltage (806): the storage device detects (808) a unique location associated with the storage device; determines (810) a time delay for the storage device in accordance with the unique location; and delays (812) at least one operation of the PCP by the determined time delay. In some implementations, delaying at least one operation of the PCP includes delaying enabling charging of an energy storage device. In some implementations, delaying at least one operation of the PCP includes delaying achieving a predefined internal state. In some implementations, delaying at least one operation of the PCP includes delaying operating the PCP in a second mode. As described above with respect to FIG. 7, in some embodiments, the unique location associated with the storage device includes an address (sometimes called a slot location), while in other embodiments, the unique location associated with the storage device includes an address (e.g., slot location 0) and one or more other location indicators (e.g., a group number). For example, in some embodiments, the unique location associated with storage device 120-2 (FIG. 7) is slot location 1 of group number 1, as described above with respect to FIG. 7. In some implementations, determining the time delay for the storage device in accordance with the unique location associated with the storage device includes determining the time delay for the storage device in accordance with the address (e.g., slot location) of the storage device. In some embodiments, determining the time delay for the storage device in accordance with the unique location associated with the storage device includes determining the time delay for the storage device in accordance with the address (e.g., slot location) of the storage device and in accordance with one or more location indicators (e.g., group number) of the storage device.

While the PCP is powered using the first input voltage (806): the storage device operates (814) the PCP in a first mode. In some implementations, the first mode is an initialization mode. In some implementations, the first mode is a low power mode.

In some embodiments, while operating in the first mode, the PCP detects (816) presence of components of the storage device. For example, in accordance with some implementations, PCP 202 in FIG. 1 detects the presence of storage controller 128 and NVM controllers 130 (e.g., NVM controller 130-1 through NVM controller 130-m), while in the first mode.

In some embodiments, while operating in the first mode, the PCP enables (818) power to a plurality of power regulators on the storage device. For example, in accordance with some implementations, PCP 202 in FIG. 2 enables power to a plurality of power regulators on storage device 120 via power storage and distribution module 204. In some implementations, the PCP enables power to (e.g., enables the provision of power to) the plurality of power regulators to allow the input capacitors on each regulator to charge. In some implementations, while operating in the first mode, the PCP enables power to the plurality of power regulators, but does not enable them for operation.

In some embodiments, the plurality of power regulators supplies power (820) to a plurality of controllers on the storage device. For example, in accordance with some implementations, the plurality of power regulators supply power to storage controller 128 and NVM controllers 130 on storage device 120. In some implementations, the plurality of power regulators supply power to the plurality of controllers only when enabled for operation by the PCP (e.g., PCP 202, FIG. 2). In some implementations, at least a subset of the plurality of controllers are NVM controllers (e.g., flash controllers). In other implementations, at least a subset of the plurality of controllers control one or more other types of non-volatile storage devices.

While the PCP is powered using the first input voltage (806): the storage device enables (822) charging of an energy storage device. For example, in accordance with some implementations, PCP 202 in FIG. 2 enables charging of energy storage device 205, while PCP 202 is being powered by the first input voltage. In some implementations, the PCP enables charging of the energy storage device via an energy storage device module (e.g., energy storage device module 310, FIG. 3). In some implementations, the energy storage device is charged using a higher voltage than the input voltage provided to the storage device (e.g., $V_{holdup}$ 406 in FIG. 4). In some implementations, the energy storage device is charged with dynamic inrush current control. In some implementations, an energy storage device module (e.g., energy storage device module 310, FIG. 3) is used to monitor the energy storage device to ensure capacitors in the energy storage device are charged to at least a predefined minimum charge level threshold, as described above with respect to FIG. 3.

In some embodiments, the energy storage device (e.g., energy storage device 205, FIG. 2) comprises (824) one or more capacitors. In some implementations, the energy storage device includes one or more inductors or any other passive elements that store energy.

In some embodiments, the energy storage device is charged using (826) a second input voltage. For example, in accordance with some implementations, the second input voltage is $V_{dd}$ 402 and energy storage device 205 in FIG. 4 is charged using input voltage $V_{dd}$ 402 via boost circuitry 420.

In some embodiments, prior to charging the energy storage device, the storage device monitors (828) the second input voltage to determine whether the second input voltage stays within predetermined boundaries. In some implementations, the PCP (e.g., PCP 202, FIG. 4) monitors the second input voltage. In some implementations, the voltage comparator circuitry (e.g., voltage comparator circuitry 206, FIG. 2) monitors the second input voltage. In some implementations, PCP 202 is configured to detect an under or over voltage event in the second input voltage (e.g., $V_{dd}$ 402, FIG. 4). For example, if the target voltage for $V_{dd}$ 402 is 1.5 volts, the under-voltage threshold may be 1.5 volts minus 5% (i.e., 1.425 volts) and the over-voltage threshold may be 1.5 volts plus 5% (i.e., 1.575 volts). In this example, the under-voltage threshold and the over-voltage threshold are the predetermined boundaries.

In some embodiments, the second input voltage corresponds (830) to a normal power bus. In some implementations, the second input voltage is $V_{dd}$. In some implementations, the second input voltage is 1.35 volts. In some implementations, the second input voltage is less than the first input voltage. For example, in accordance with some implementations, $V_{spd}$ 404 in FIG. 4 is the first input voltage and supplies 3.3 volts and $V_{dd}$ 402 is the second input voltage and supplies 1.5 volts or 1.35 volts or 1.25 volts.

In some embodiments, while being powered using the first input voltage, the PCP is incapable (832) of sustained operation at a higher performance level. In some implementations, the first input voltage has insufficient current to power the PCP if the PCP is operating at a higher performance level (e.g., higher frequency) for a sustained period. In some implementations, the higher performance level is a higher frequency. In this context, a higher frequency means that the clock rate or frequency at which the PCP executes instructions is higher when the PCP is operating at the higher performance level (e.g., in the second mode of operation discussed elsewhere in this document) than when the PCP is operating in the first mode, also sometimes herein called a startup mode.

After achieving a predefined internal state, which includes the energy storage device charged to a predefined level, the storage device powers (834) the PCP using a power supply voltage distinct from the first input voltage. For example, if the predefined minimum charge level threshold is 98% (or, alternatively, 95% or 90%) of charge capacity, supervisory module (e.g., supervisory module 126, FIG. 1) monitors the energy storage device (e.g., energy storage device 205, FIG. 2) to ensure the capacitor(s) in the energy storage device are charged to at least 98% (or, alternatively, 95% or 90%) of charge capacity.

In some embodiments, achieving the predefined internal state further includes completing (836) a predefined start-up routine. In some implementations, the predefined start-up routine includes detecting the presence of components in the storage device, powering up a plurality of power regulators, and monitoring an input voltage for stability. In some implementations, the PCP (e.g., PCP 202) achieves the predefined internal state. In some implementations, the predefined start-up routine includes signaling to the host (e.g., computer system 110) that the storage device (e.g., storage device 120) is ready to receive host commands.

In some embodiments, the power supply voltage is generated (838) from a second input voltage. For example, in accordance with some implementations, power supply voltage (e.g., $V_{ps}$ 432, FIG. 4) is charged using input voltage $V_{dd}$ 402 via keeper 424.

In some embodiments, the second input voltage is insufficient (840) to power the PCP directly. In some implementations, the PCP requires a 3.3 volt power source while the second input voltage is 1.5 volts. For example, in accordance with some implementations, $V_{dd}$ 402 in FIG. 4 is 1.5 volts and PCP 202 requires a 3.3 volt power source. In this example, keeper 424 boosts the voltage of $V_{dd}$ 402 to provide $V_{ps}$ 432 at 3.3 volts to PCP 202.

While the PCP is powered using the power supply voltage, the storage device operates (842) the PCP in a second mode, where the PCP operates at a higher performance level in the second mode than in the first mode. In some implementations, the PCP operates at 8 kHz (i.e., operates at a clock rate of 8 kHz) in the first mode and 64 kHz (i.e., operates at a clock rate of 64 kHz) in the second mode. In some implementations, the first input voltage has limited current capability in comparison with the power supply voltage. In some implementations, a power mode control module (e.g., power mode control module 317, FIG. 3) switches the PCP from the first mode to the second mode when a predefined condition precedent is achieved (e.g., when a predefined internal state is achieved).

In some embodiments, operating at a higher performance level includes operating (844) at a higher frequency. In some implementations, operating at a higher performance level includes operating at an adjusted frequency for more efficient operation.

In some embodiments, while operating in the second mode, the PCP initiates (846) operation of a plurality of power regulators on the storage device.

In some embodiments, while operating in the second mode, the PCP enables (848) power to a plurality of controllers on the storage device. For example, in accordance with some implementations, PCP 202 in FIG. 2 enables power to storage controller 128 and NVM controllers 130, while operating in the second mode. In some implementations, a power switch module (e.g., power switch module 316) in the PCP enables power (i.e., enables the provision of power) to the plurality of controllers.

In some embodiments, while operating in the second mode, the PCP initiates (850) normal operation of the storage device. In some implementations, normal operation of the storage device includes receiving commands from the host (e.g., computer system 110, FIG. 1) and performing read and write operations on the NVM (e.g., NVM 140, 142, FIG. 1).

In some implementations, with respect to any of the methods described above, the non-volatile memory is a single NVM device (e.g., flash memory device), while in other implementations, the non-volatile memory includes a plurality of NVM devices (e.g., flash memory devices).

In some implementations, with respect to any of the methods described above, a storage device includes (1) an interface for coupling the storage device to a host system, (2) an energy storage device, and (3) a power control processor (PCP), and the storage device is configured to perform or control performance of any of the methods described above.

In some implementations, with respect to any of the methods described above, a storage device includes (1) an interface for coupling the storage device to a host system, (2) an energy storage device, and (3) a PCP, and the PCP is configured to perform or control performance of any of the methods described above.

It will be understood that, although the terms "first," "second," etc. may be used herein to describe various elements, these elements should not be limited by these terms. These terms are only used to distinguish one element from another. For example, a first contact could be termed a second contact, and, similarly, a second contact could be termed a first contact, which changing the meaning of the description, so long as all occurrences of the "first contact" are renamed consistently and all occurrences of the second contact are renamed consistently. The first contact and the second contact are both contacts, but they are not the same contact.

The terminology used herein is for the purpose of describing particular embodiments only and is not intended to be limiting of the claims. As used in the description of the embodiments and the appended claims, the singular forms "a", "an" an "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined [that a stated condition precedent is true]" or "if [a stated condition precedent is true]" or "when [a stated condition precedent is true]" may be construed to mean "upon determining" or "in response to determining" or "in accordance with a determination" or "upon detecting" or "in response to detecting" that the stated condition precedent is true, depending on the context. Similarly, the phrase "while the PCP is powered" may be construed to mean "while powering the PCP", depending on the context, and the phrase "enables power to" may be construed to mean "enables the provision of power to."

The foregoing description, for purpose of explanation, has been described with reference to specific implementations. However, the illustrative discussions above are not intended to be exhaustive or to limit the claims to the precise forms disclosed. Many modifications and variations are possible in view of the above teachings. The implementations were chosen and described in order to best explain principles of operation and practical applications, to thereby enable others skilled in the art.

What is claimed is:

1. A method of power management in a storage device, the method comprising:
    powering a power control processor (PCP) using a first input voltage;
    while the PCP is powered using the first input voltage:
        operating the PCP in a first mode; and
        enabling charging of an energy storage device;
    after achieving a predefined internal state, which includes the energy storage device charged to a predefined level, powering the PCP using a power supply voltage distinct from the first input voltage; and
    while the PCP is powered using the power supply voltage, operating the PCP in a second mode, wherein the PCP operates at a higher performance level in the second mode than in the first mode.

2. The method of claim 1, wherein operating at a higher performance level includes operating at a higher frequency.

3. The method of claim 1, wherein the first input voltage corresponds to a low power communication bus.

4. The method of claim 1, wherein, while operating in the first mode, the PCP detects presence of components of the storage device.

5. The method of claim 1, wherein achieving the predefined internal state further includes completing a predefined start-up routine.

6. The method of claim 1, wherein, while operating in the second mode, the PCP initiates operation of a plurality of power regulators on the storage device.

7. The method of claim 1, wherein, while operating in the first mode, the PCP enables power to a plurality of power regulators on the storage device.

8. The method of claim 7, wherein the plurality of power regulators supply power to a plurality of controllers on the storage device.

9. The method of claim 1, wherein, while operating in the second mode, the PCP enables power to a plurality of controllers on the storage device.

10. The method of claim 1, wherein, while operating in the second mode, the PCP initiates normal operation of the storage device.

11. The method of claim 1, wherein, while being powered using the first input voltage, the PCP is incapable of sustained operation at said higher performance level.

12. The method of claim 1, wherein the energy storage device comprises one or more capacitors.

13. The method of claim 1, wherein the power supply voltage is generated from a second input voltage.

14. The method of claim 13, wherein the second input voltage corresponds to a normal power bus.

15. The method of claim 13, wherein the second input voltage is insufficient to power the PCP directly.

16. The method of claim 1, wherein the energy storage device is charged using a second input voltage.

17. The method of claim 16, further comprising, prior to charging the energy storage device, monitoring the second input voltage to determine whether the second input voltage stays within predetermined boundaries.

18. The method of claim 1, further comprising, while the PCP is powered using the first input voltage:
    detecting a unique location associated with the storage device;
    determining a time delay for the storage device in accordance with the unique location; and
    delaying at least one operation of the PCP by the determined time delay.

19. A storage device, comprising:
    an interface for coupling the storage device to a host system;
    an energy storage device; and
    a power control processor (PCP), the storage device configured to:
        power the PCP using a first input voltage;
        while the PCP is powered using the first input voltage:
            operate the PCP in a first mode; and
            charge an energy storage device;
        after achieving a predefined internal state, which includes the energy storage device charged to a predefined level, power the PCP using a power supply voltage distinct from the first input voltage; and
        while the PCP is powered using the power supply voltage, operate the PCP in a second mode, wherein the PCP operates at a higher frequency in the second mode than in the first mode.

20. The storage device of claim 19, wherein operating at a higher performance level includes operating at a higher frequency.

21. The storage device of claim 19, wherein the power supply voltage is generated from a second input voltage.

22. The storage device of claim 21, wherein the second input voltage corresponds to a normal power bus.

23. The storage device of claim 21, wherein the second input voltage is insufficient to power the PCP directly.

24. A non-transitory computer readable storage medium, storing one or more programs for execution by one or more processors of a storage device having a plurality of controllers and a power control processor (PCP), the one or more programs including instructions for:
    powering a power control processor (PCP) using a first input voltage;
    while the PCP is powered using the first input voltage:
        operating the PCP in a first mode; and
        enabling charging of an energy storage device;
    after achieving a predefined internal state, which includes the energy storage device charged to a predefined level, powering the PCP using a power supply voltage distinct from the first input voltage; and
    while the PCP is powered using the power supply voltage, operating the PCP in a second mode, wherein the PCP operates at a higher performance level in the second mode than in the first mode.

25. The storage medium of claim 24, wherein operating at a higher performance level includes operating at a higher frequency.

26. The storage medium of claim 24, wherein the power supply voltage is generated from a second input voltage.

27. The storage medium of claim 26, wherein the second input voltage corresponds to a normal power bus.

28. The storage medium of claim 26, wherein the second input voltage is insufficient to power the PCP directly.

* * * * *